(12) United States Patent
Cassella et al.

(10) Patent No.: US 12,549,163 B2
(45) Date of Patent: Feb. 10, 2026

(54) LOW POWER ISING SYSTEM

(71) Applicants: Northeastern University, Boston, MA (US); University of Florida Research Foundation, Inc., Gainesville, FL (US)

(72) Inventors: Cristian Cassella, Boston, MA (US); Nicolas Casilli, Kendall Park, NJ (US); Onurcan Kaya, Boston, MA (US); Philip Feng, Gainesville, FL (US); Tahmid Kaisar, Gainesville, FL (US)

(73) Assignees: Northeastern University, Boston, MA (US); University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 18/524,421

(22) Filed: Nov. 30, 2023

(65) Prior Publication Data

US 2024/0178822 A1 May 30, 2024

Related U.S. Application Data

(60) Provisional application No. 63/429,094, filed on Nov. 30, 2022.

(51) Int. Cl.
*H03K 5/00* (2006.01)
*H03K 17/92* (2006.01)
*H03K 21/08* (2006.01)

(52) U.S. Cl.
CPC ......... *H03K 5/00006* (2013.01); *H03K 17/92* (2013.01); *H03K 21/08* (2013.01)

(58) Field of Classification Search
CPC .. H03B 5/1228; H03B 5/1212; H03B 5/1243; H03B 5/1215; H03B 5/1296; H03B 5/1265; H03B 5/124; H03B 5/1253; H03B 27/00; H03B 2200/0074; H03B 5/1293; H03B 5/1231; H03B 5/1218; H03B 5/1206; H03B 2200/0078; H03B 2201/0208; H03B 5/04; H03B 5/1256; H03B 5/12;

(Continued)

(56) References Cited

U.S. PATENT DOCUMENTS 7,102,465 B2 * 9/2006 Utsunomiya ........ H03H 7/1775
  333/17.1
7,863,987 B2 * 1/2011 Kanda ...................... H03L 7/24
  331/117 R (Continued)

OTHER PUBLICATIONS

Böhm et al., "A poor man's coherent Ising machine based on opto-electronic feedback systems for solving optimization problems", Nature Communications, 10, (2019), pp. 1-9.

(Continued)

*Primary Examiner* — John W Poos
(74) *Attorney, Agent, or Firm* — Verrill Dana, LLP

(57) ABSTRACT

Provided herein are Ising machines having a resonant input mesh driven by a pump signal, a resonant output mesh coupled to the input mesh through a nonlinear component to form a parametric frequency divider (PFD), and the nonlinear component configured to passively activate, responsive to the pump signal exceeding a threshold power, a parametric oscillation between the input and output meshes having an oscillation frequency equal to half an angular input frequency of the pump signal, wherein an output signal of the PFD can be switched between an in-phase state and an out-of-phase state.

21 Claims, 26 Drawing Sheets

(58) Field of Classification Search
CPC . H03B 1/04; H03B 5/18; H03B 5/366; H03B 1/00; H03B 2200/0038; H03B 2200/004; H03B 5/1209; H03B 5/1271; H03B 2200/0076; H03B 2200/0088; H03B 5/08; H03B 5/1278; H03B 2200/0048; H03B 2200/0052; H03B 5/1262; H03B 5/1852; H03B 5/24; H03B 2200/009; H03B 23/00; H03B 5/1225; H03B 5/1237; H03B 5/32; H03B 19/00; H03B 2200/0012; H03B 2200/007; H03B 2201/0266; H03B 5/1234; H03B 5/1259; H03B 5/1268; H03B 11/10; H03B 19/14; H03B 2200/0008; H03B 2200/0034; H03B 2200/005; H03B 2200/0062; H03B 2200/0066; H03B 2200/0086; H03B 2201/02; H03B 2201/0216; H03B 2201/025; H03B 2201/0283; H03B 5/1203; H03B 5/1221; H03B 5/1275; H03B 5/1281; H03B 5/129; H03B 5/323; H03B 19/10; H03B 19/16; H03B 2201/011; H03B 5/02; H03B 5/10; H03B 5/1246; H03B 5/1287; H03B 5/26; H03H 7/0115; H03H 7/38; H03H 11/04; H03H 11/1213; H03H 1/0007; H03H 2007/006; H03H 7/0138; H03H 9/173; H03H 9/545; H03H 2210/012; H03H 7/12; H03H 19/004; H03H 2007/013; H03H 2009/155; H03H 2210/015; H03H 2210/025; H03H 5/12; H03H 7/1766; H03H 7/325; H03H 7/40; H03H 9/15; H03H 9/38; H03H 9/423; H03H 11/12; H03H 11/126; H03H 11/1291; H03H 2210/021; H03H 2210/028; H03H 2210/04; H03H 3/00; H03H 7/0153; H03H 7/1758; H03H 9/00

See application file for complete search history.

(56) References Cited

U.S. PATENT DOCUMENTS

| | | | | |
|---|---|---|---|---|
| 10,027,305 | B1* | 7/2018 | Kozyrev | H03H 17/0261 |
| 11,641,190 | B2* | 5/2023 | Abdulaziz | H03K 3/0315 |
| | | | | 331/57 |
| 2011/0298549 | A1* | 12/2011 | Luong | H03B 5/124 |
| | | | | 331/117 FE |

OTHER PUBLICATIONS

Mohseni et al., "Ising machines: Hardware solvers for combinatorial optimization problems", Nat Rev Phys 4, 23 pages (2022).
Lucas, "Ising formulations of many NP problems", Front. Phys., Feb. 2014, vol. 2, Article 5, 15 pages.
Kalinin et al., "Computational complexity continuum within Ising formulation of NP problems", nature communications physics (2022), pp. 1-10.
Yamaoka, "Overview of CMOS Annealing Machines", (Research and Development Group, Hitachi, 2019); 4 pages.
Cook et al., "GPU-based Ising Computing for Solving Balanced Min-Cut Graph Partitioning Problem", arXiv:1908.00210 [cs.ET]; (2019), 9 pages.
Chou et al., "Analog Coupled Oscillator Based Weighted Ising Machine", Scientific Reports, (2019); 9;14786, 10 pages.
Moy et al., "A 1,968-node coupled ring oscillator circuit for combinatorial optimization problem solving", Nature Electronics, (2022), 10 pages.
Vaidya et al., "Creating electronic oscillator-based Ising machines without external injection locking", Scientific Reports (2022); 12;981, 8 pages.
Wang et al., "OIM: Oscillator-based Ising Machines for Solving Combinatorial Optimisation Problems", 10.48550/ARXIV.1903.07163 (2019), 21 pages.
Wang et al., "Oscillator-based Ising Machine", 10.48550/ARXIV.1709.08102 (2017), 10 pages.
Houshang et al., "A Spin Hall Ising Machine", 10.48550/ARXIV.2006.02236 (2020), 20 pages.
Csaba et al., "Coupled oscillators for computing: A review and perspective", Applied Physics Reviews 7, 011302 (2020), 21 pages.
Ahmed et al., "A Probabilistic Compute Fabric Based on Coupled Ring Oscillators for Solving Combinatorial Optimization Problems", IEEE J. Solid-State Circuits (2021), 11 pages.
Mallick et al., "CMOS-compatible ising machines built using bistable latches coupled through ferroelectric transistor arrays", Scientific Reports, (2023) 13;1515, 9 pages.
Mallick et al., "Using synchronized oscillators to compute the maximum independent set", Nature Communications, (2020), 11:4689, 7 pages.
Mallick et al., "Graph Coloring using Coupled Oscillator-based Dynamical Systems", 2021 IEEE International Symposium on Circuits and Systems (ISCAS) (IEEE, Daegu, Korea, 2021) pp. 1-5.
Bashar et al., "Experimental Demonstration of a Reconfigurable Coupled Oscillator Platform to Solve the Max-Cut Problem", IEEE J. Explor. Solid-State Comput. Devices Circuits 6, 116 (2020), 6 pages.
Bashar et al., "Experimental Investigation of the Dynamics of Coupled Oscillators as Ising Machines", IEEE Access 9, 148184 (2021), 7 pages.
Zhang et al., "Oscillator-Network-Based Ising Machine", Micromachines 13, 10.3390/mi13071016 (2022), 19 pages.
Hamerly et al., "Experimental investigation of performance differences between coherent Ising machines and a quantum annealer", Science Advances, (2019);5: eaau0823, 10 pages.
Strinati et al., "Can nonlinear parametric oscillators solve random Ising models?", Physical Review Letters, (2021), 126(14), 9 pages.
Heugel et al., "Ising machines with strong bilinear coupling", Physical Review Research 4, 013149 (2022), 8 pages.
English et al., "An Ising machine based on networks of subharmonic electrical resonators", Communications Physics, 5, (2022), 11 pages.
Bello et al., "Persistent coherent beating in coupled parametric oscillators", Physical Review Letters (2019), arXiv:1901.06202v4 [physics.optics], 8 pages.
Feng et al., "Concepts and Key Technologies of Microelectromechanical Systems Resonators", Micromachines (2022), 13, 2195, 26 pages.
Senkal et al., "100K Q-Factor Toroidal Ring Gyroscope Implemented in Wafer-Level Epitaxial Silicon Encapsulation Process", 2014 IEEE 27th International Conference on Micro Electro Mechanical Systems (MEMS) (IEEE, San Francisco, CA, USA, 2014) pp. 24-27.
Bereyhi et al., "Perimeter Modes of Nanomechanical Resonators Exhibit Quality Factors Exceeding 10^9 at Room Temperature", Physical Review X 12, 021036 (2022), pp. 1-19.
Acebrón et al., "The Kuramoto model: a simple paradigm for synchronization phenomena", Reviews of Modern Physics, vol. 77, Jan. 2005, pp. 137-185.
Hussein et al., "A chip-less and battery-less subharmonic tag for wireless sensing with parametrically enhanced sensitivity and dynamic range", Scientific Reports (2021), 11, 3782, 12 pages.
Hussein et al., "Reflective Parametric Frequency Selective Limiters with sub-dB Loss and uWatts Power Thresholds", IEEE Transactions on Microwave Theory and Techniques 69, 2989 (2021), 12 pages.
Villanueva et al., "A Nanoscale Parametric Feedback Oscillator", Nano Letters 11, 5054 (2011), pp. 5054-5059.
Cassella et al., "Phase noise suppression through parametric filtering", Applied Physics Letters, 110, 063503 (2017), 5 pages.
Hussein et al., "Systematic Synthesis and Design of Ultralow Threshold 2:1 Parametric Frequency Dividers", IEEE Trans. Microwave Theory Techn. vol. 68, No. 8, (2020), pp. 3497-3509.

(56) References Cited

OTHER PUBLICATIONS

Casilli et al., "Nonvolatile State Configuration of Nano-Watt Parametric Ising Spins Through Ferroelectric Hafnium Zirconium Oxide MEMS Varactors", New Computing Devices and Systems with MEMS/NEMS, vol. 36 (IEEE, Munich, Germany, 2023) pp. 511-514.

Rhoads et al., "Generalized parametric resonance in electrostatically actuated microelectromechanical oscillators", Journal of Sound and Vibration, 296, (2006), pp. 797-829.

Su et al., "CIM-Spin: A 0.5-to-1.2V Scalable Annealing Processor Using Digital Compute-In-Memory Spin Operators and Register-Based Spins for Combinatorial Optimization Problems", IEEE Journal of Solid-State Circuits, vol. 57, No. 7, Jul. 2022, pp. 2263-2273.

Su et al., "FlexSpin: A Scalable CMOS Ising Machine with 256 Flexible Spin Processing Elements for Solving Complex Combinatorial Optimization Problems", IEEE Journal of Solid-State Circuits, vol. 59, No. 8, Aug. 2024, pp. 2659-2670.

Cassella et al., "Aluminum Nitride Cross-Sectional Lame Mode Resonators", J. Microelectromech. Syst. 25, 275 (2016), pp. 275-285.

Strinati et al., "Coherent dynamics in frustrated coupled parametric oscillators", New J. Phys. 22, 085005 (2020), 22 pages.

Hussein et al., "Capturing and recording cold chain temperature violations through parametric alarm-sensor tags", Appl. Phys. Lett. 119, 014101 (2021).

Mallick et al., "Overcoming the Accuracy vs. Performance Trade-off in Oscillator Ising Machines", in 2021 IEEE International Electron Devices Meeting (IEDM) (IEEE, San Francisco, CA, USA, 2021) pp. 40.2.1-40.2.4.

Dutta et al., "Experimental Demonstration of Phase Transition Nano-Oscillator Based Ising Machine", in 2019 IEEE International Electron Devices Meeting (IEDM) (IEEE, San Francisco, CA, USA, 2019) pp. 37.8.1-37.8.4.

Pillai et al., "Piezoelectric MEMS Resonators: A Review", IEEE Sensors J. Vol. 21, No. 11, pp. 12589-12605 (2021).

Ramirez et al., "Nonlinear analysis and design of frequency selective limiters based on parametric circuits", in 2008 IEEE MTT-S International Microwave Symposium Digest (2008) pp. 947-950.

\* cited by examiner

"Ferromagnetic" Circuit

"Anti-Ferromagnetic" Circuit

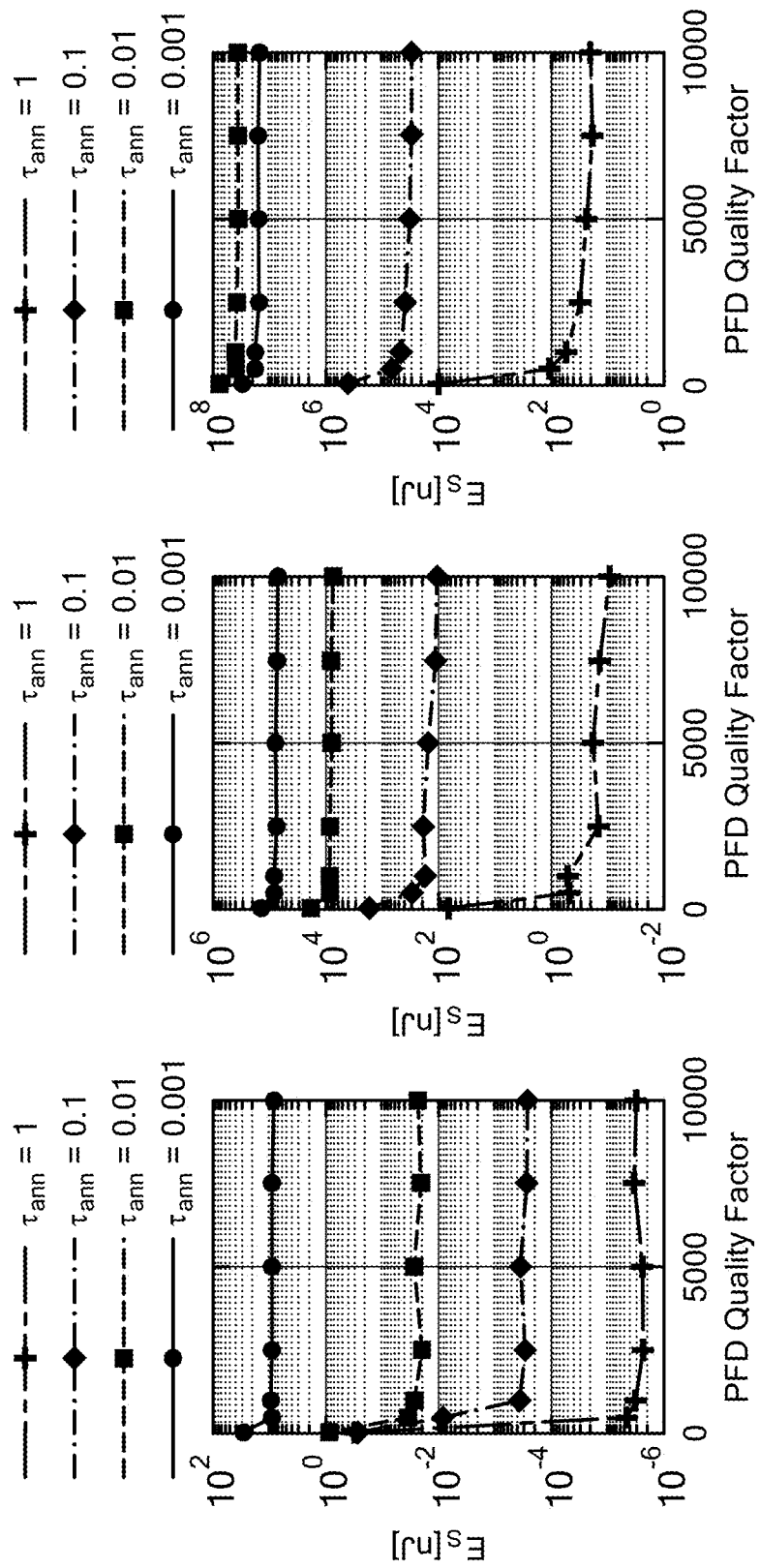

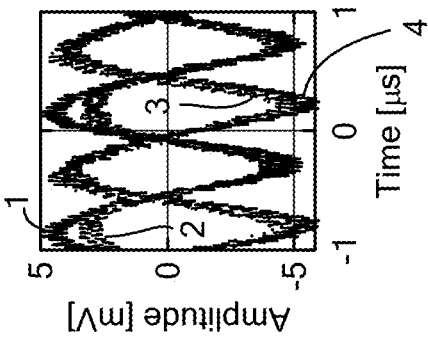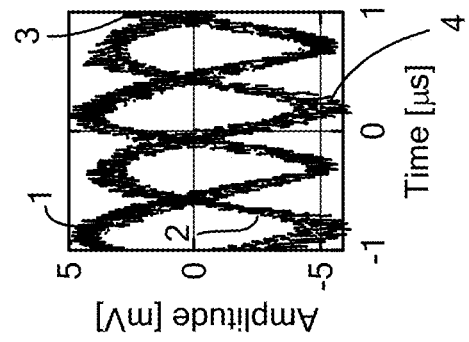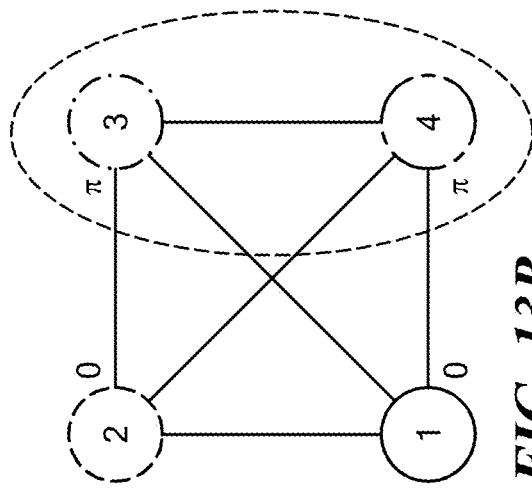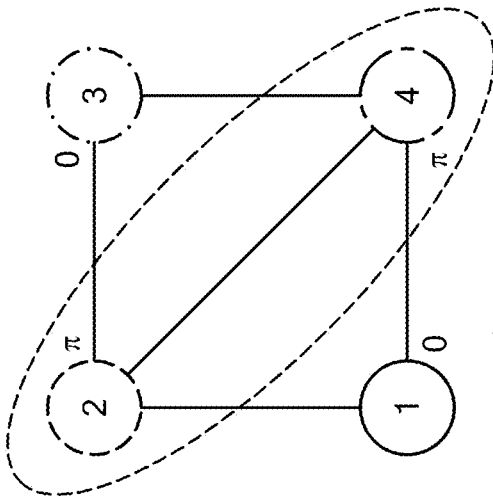
FIG. 13B
FIG. 13D
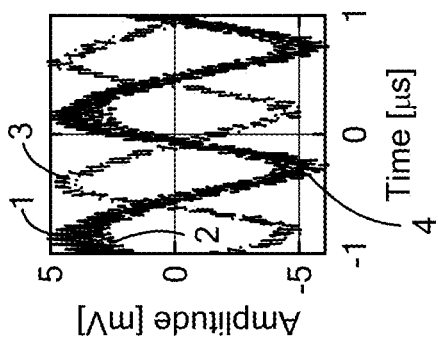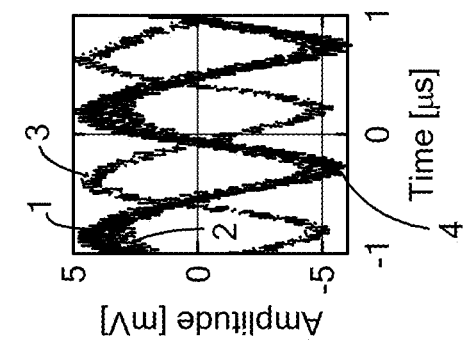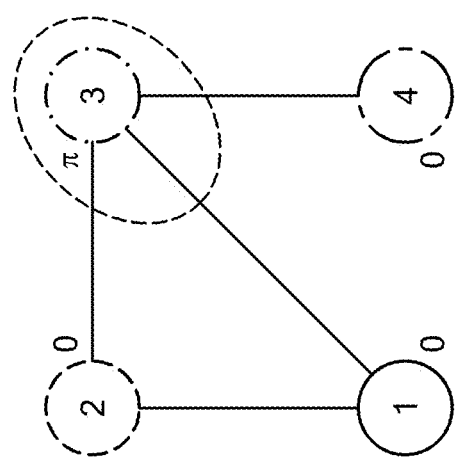
FIG. 13A
FIG. 13C

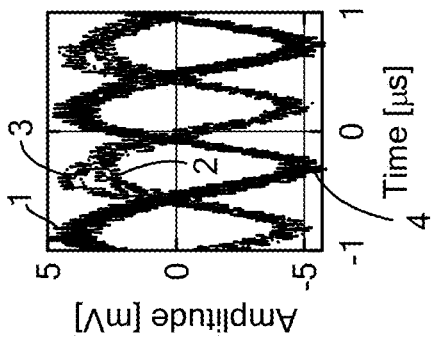
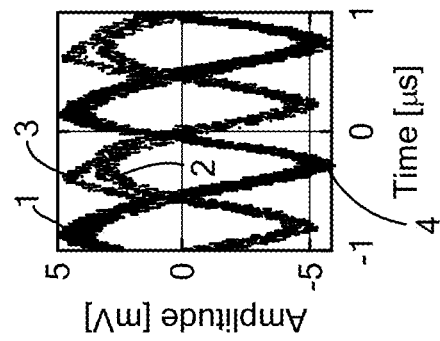
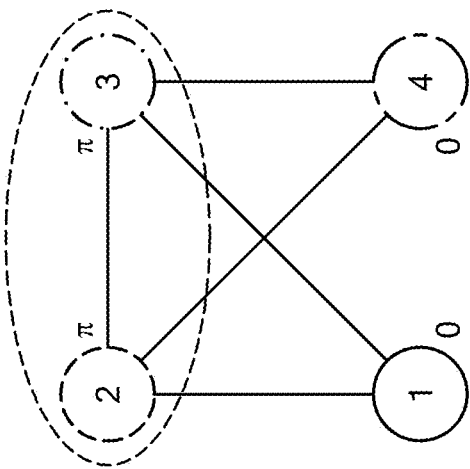
FIG. 13F
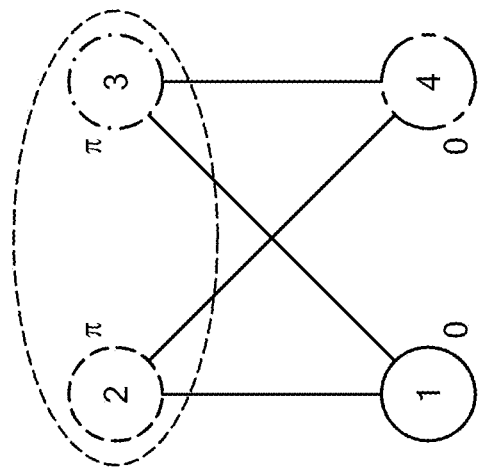
FIG. 13H
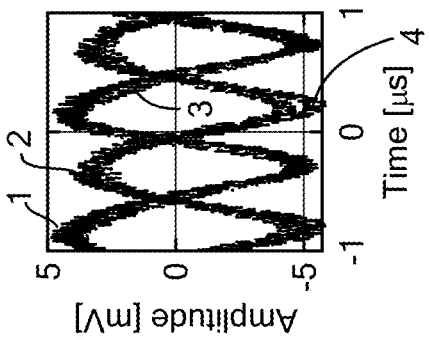
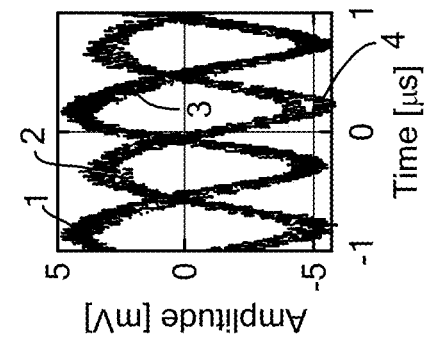
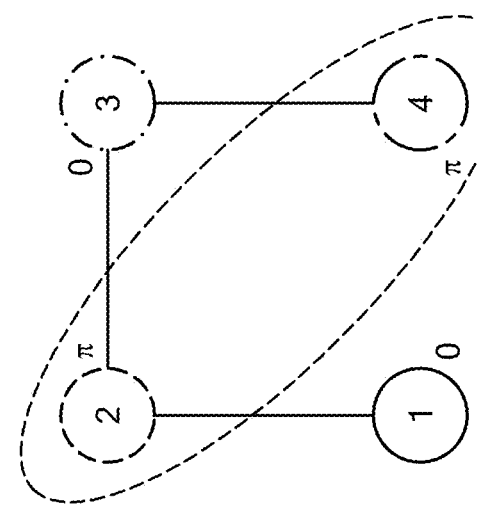
FIG. 13E
FIG. 13G

LOW POWER ISING SYSTEM

CROSS REFERENCE TO RELATED APPLICATIONS

This application claims benefit under 35 U.S.C. § 119(e) of U.S. Provisional Application No. 63/429,094, filed on 30 Nov. 2022, entitled "Low Power Ising System," the entirety of which is incorporated by reference herein.

STATEMENT REGARDING FEDERALLY SPONSORED RESEARCH OR DEVELOPMENT

This invention was made with government support under Grant Numbers 2103351 and 2103091 awarded by the National Science Foundation. The government has certain rights in the invention.

BACKGROUND

Modern applications in science, economics, and engineering would benefit from solving a variety of nondeterministic polynomial-time (NP) hard problems. Unfortunately, many of these problems are left unsolved because existing "von Neumann" computing architectures are unable to solve them. This is largely due to a phenomenon commonly referred to as the Von-Neumann bottleneck, which limits the capability of most current computing architectures to efficiently solve large-scale nondeterministic polynomial-time (NP) hard problems within a reasonable amount of time. To address this limitation, a new approach to solving NP-hard problems has emerged in the form of quantum-inspired adiabatic hardware-solvers called Ising machines (IMs).

An IM can be defined as a network of artificial spins, arranged and interconnected according to the problem at hand. This machine can accurately solve a combinatorial optimization problem (COP) by identifying the spin-state configuration that minimizes the corresponding Ising Hamiltonian. Several systems have been developed in recent years to perform an efficient minimization of the Ising Hamiltonian, including: D-Wave systems, Coherent Ising machines (CIMs), photonic IMs, SRAM-based IMs, GPU-based IMs, and oscillator-based Ising machines (OIMs). D-Wave systems rely on superconducting devices requiring cryogenic operating temperatures near zero kelvin to function properly. Consequently, they are bulky and consume a considerable amount of power due to the necessity of cryogenic refrigeration. CIMs utilize fiber-based degenerate optical parametric oscillators to generate the spins and field-programmable-gate-arrays (FPGAs) to digitize the spins' coupling. As a result, they are also hardly usable when targeting a small form-factor and a low power consumption. Alternative photonic IMs based on spatial light modulation or recurrent Ising sampling have also been reported, showing promise for solving large-scale COPs. However, relying on these solvers also comes with challenges, primarily related to unfavorable times-to-solution caused by the required intense signal processing. SRAM-based and GPU-based IMs are digital hardware implementations of the simulated annealing algorithm or of one of its variants. These IMs can be manufactured using the same complementary metal-oxide-semiconductor (CMOS) fabrication processes utilized for mass production of the integrated circuits in consumer electronics, offering significant benefits in terms of production cost, reprogrammability, and form-factor. However, the performance of these IMs depends on the problem being solved and can be significantly degraded for problems demanding heavy sequential computation.

For these reasons, the pursuit of highly-miniaturized and low-power IMs has recently shifted towards OIMs, whose physics-inspired processing enables a higher degree of parallelism during the computation compared to digital solvers. OIMs leverage the collective dynamics of networks of bistable coupled electronic oscillators to perform the computation in an analog fashion. Among the demonstrated OIMs, those using "parametrons" as spins were the first ones to be proposed. Parametrons attain phase bistability by triggering a parametric oscillation in a circuit composed of one nonlinear resonator. In this regard, the dynamics of coupled parametric oscillators have been studied in the last few years to benchmark the computing performance achievable by CIMs and by parametron based IMs. However, the accuracy of the retrieved problem solutions has thus far not been proven.

More discouraging, all known parametrons require hundreds of milliWatts of input power to activate their oscillation. Such a high power consumption severely limits the number of spins-to-solution required for solvable problems and, therefore, severely limits the scale of the problems capable of being solved by such systems. Accordingly, to the knowledge of the inventors, no attempt has ever been made to build large-scale electronic IMs based on parametrons.

Instead, as an alternative, OIMs utilizing subharmonic-injection-locked (SHIL) oscillators as spins have garnered significant attention in recent years. In these OIMs, referred to herein as "SHIL IMs", an artificial spin is represented by the bistable phase of a SHIL oscillator's output signal, which can be shifted by either 0 or 7 with respect to the output phase of a reference oscillator. SHIL IMs are generally analyzed by using the Kuramoto model, which only considers the phase of the SHIL oscillators' output signal and not the amplitude. The power consumed by each oscillator in SHIL IMs is typically in the hundreds of $\mu$Watts-range due to the need to sustain the oscillation, trigger the injection-locking regime, and synthesize the spin-coupling. As a result, SHIL IMs are also not easily scalable to solve realistically sized NP-hard problems while maintaining a low (or even reasonable) power consumption.

SUMMARY

Described herein are methods and systems for a new class of Ising machines (IMs) that rely on coupled parametric frequency dividers (PFDs) as macroscopic artificial spins. The PFDs disclosed herein rely on a nonlinear reactance, such as, for example, a diode or a varactor, to passively activate a parametric oscillation at half of their driving signal's natural frequency ($\omega_0$) when the input power levels exceed a certain threshold ($P_{th}$). Unlike existing parametrons, the PFDs provided herein couple a set of four harmonically related resonances to boost the effectiveness of the parametric modulation in their circuit, thereby enabling $P_{th}$ values that are orders of magnitude lower than existing parametrons. Additionally, unlike IM counterparts based on subharmonic-injection locking (SHIL), the PFD IMs described herein do not require strong injected continuous-wave signals or applied DC voltages.

Therefore, PFD IMs show a significantly lower power consumption per spin compared to SHIL-based IMs, making it feasible to accurately solve large-scale combinatorial optimization problems (COPs) that are hard or even impossible to solve by using the current von Neumann computing architectures. In particular, using high quality factor resonators in the PFD design results in the described PFD IMs achieving a nanoWatt-level power-per-spin. In addition, experimentation has shown that the described PFD IMs provide a significant a speed-up of phase synchronization among the PFDs, resulting in shorter time-to-solution and lower energy-to-solution despite using component resonators having a longer relaxation time than those used in some other IMs. As a proof of concept, a 4-node PFD IM has been demonstrated as described below. This 4-node PFD IM correctly solves a set of Max-Cut problems while consuming just 600 nanoWatts per-spin.

As described and documented below, such power consumption-per-spin is two orders of magnitude lower than the power-per-spin of state of the art SHIL-based IMs operating at the same frequency.

In one aspect, an Ising machine is provided. The Ising machine includes a resonant input mesh driven by a pump signal. The Ising machine also includes a resonant output mesh coupled to the input mesh through a nonlinear component to form a parametric frequency divider (PFD). The Ising machine also includes the nonlinear component configured to passively activate, responsive to the pump signal exceeding a threshold power, a parametric oscillation between the input and output meshes having an oscillation frequency equal to half an angular input frequency of the pump signal, wherein an output signal of the PFD can be switched between an in-phase state and an out-of-phase state.

In some embodiments, a characteristic of the nonlinear component is modulated at the angular input frequency of the pump signal. In some embodiments, the nonlinear component has a nonlinear reactance. In some embodiments, the nonlinear component includes one or more of a diode, a varactor, or a combination thereof. In some embodiments, the nonlinear component includes a varactor and an inductor, wherein the input mesh and the output mesh are coupled through the varactor and the inductor. In some embodiments, the input mesh includes an input filter to constrain the pump signal within the input mesh to the angular input frequency of the pump signal. In some embodiments, the output mesh includes an output filter to constrain the output signal within the output mesh to half of the angular input frequency of the pump signal. In some embodiments, the output mesh is configured to series-resonate at half the angular input frequency of the pump signal. In some embodiments, each of the input mesh and the output mesh includes a resonator. In some embodiments, each resonator includes one or more of an electrical resonator, a MEMS resonator, a NEMS resonator, an optical resonator, a non-Hermitian resonator, an electromagnetic resonator, or combinations thereof. In some embodiments, the electrical resonator includes an LC tank. In some embodiments, the nonlinear component and the output mesh are configured as an electrical Mathieu Resonator having the nonlinear component, an intrinsic loss resistance of the PFD, and a load resistance of the PFD. In some embodiments, the threshold power of the pump signal is less than 1 µW. In some embodiments, the threshold power of the pump signal is 600 nW or less. In some embodiments, the input mesh and the output mesh each form at least one of an electrical circuit, an integrated circuit, a micro-electromechanical system (MEMS), a nano-electromechanical system (NEMS), an optical system, a non-Hermitian system, or combinations thereof.

In another aspect, an Ising system is provided. The Ising system includes a plurality of parametric frequency dividers (PFDs). Each PFD includes a resonant input mesh driven by a pump signal. Each PFD also includes a resonant output mesh coupled to the input mesh through a nonlinear component. Each PFD also includes the nonlinear component configured to passively activate, responsive to the pump signal exceeding a threshold power ($P_{th}$), a parametric oscillation between the input and output meshes having an oscillation frequency equal to half an angular input frequency of the pump signal. The Ising system also includes a plurality of dissipative couplings, each connecting two or more of the output meshes of the plurality of PFDs. The Ising system also includes wherein an output signal of each of the PFDs is switchable between an in-phase state and an out-of-phase state. The Ising system also includes wherein the pump signal exceeding the threshold power drives an oscillating spin coupling between at least one pair of PFDs connected by one of the dissipative couplings.

In some embodiments, the nonlinear component and the output mesh of each PFD are configured as an electrical Mathieu Resonator having the nonlinear component, an intrinsic loss resistance of the PFD, a load resistance of the PFD, and half of a coupling resistance of the dissipative coupling connected to the output mesh. In some embodiments, the threshold power required for activation of the parametric oscillation in the out-of-phase state of the PFDs is less than the threshold power required for activation of the parametric oscillation in the in-phase state of the PFDs. In some embodiments, a collective spin-configuration of the plurality of PFDs is indicative of a solution to a large-scale nondeterministic polynomial-time (NP) hard problem. In some embodiments, a collective spin-configuration of the plurality of PFDs is indicative of a solution to a combinatorial optimization problem. In some embodiments, each variable of the combinatorial optimization problem is mapped to a specific one of the PFDs.

In still another aspect, an Ising machine is provided. The Ising machine includes two parametric oscillators driven by a pump signal and coupled through a series LC network. The Ising machine also includes the series LC network comprising two inductors and a microfabricated MEMS varactor, wherein the pump signal drives an oscillating spin coupling between the parametric oscillators at a resonance frequency, and wherein output signals of the parametric oscillators can be switched between an in-phase state and an out-of-phase state.

In some embodiments, the Ising machine provides a nonvolatile ferroelectric memory characterized by a shift of the resonance frequency resulting in a shift between in-phase output signals of the parametric oscillators, indicative of ferromagnetic interaction, and out-of-phase output signals of the parametric oscillators, indicative of anti-ferromagnetic interaction. In some embodiments, zero power is used to maintain the oscillating spin coupling. In some embodiments, not more than about 1 nanowatt of power is used to switch between the in-phase and out-of-phase output states.

In yet another aspect, a computation device is provided. The computation device includes an Ising machine as described above.

Additional features and aspects of the technology include the following:

1. An Ising machine comprising:
    a resonant input mesh driven by a pump signal;
    a resonant output mesh coupled to the input mesh through a nonlinear component to form a parametric frequency divider (PFD); and
    the nonlinear component configured to passively activate, responsive to the pump signal exceeding a threshold power, a parametric oscillation between the input and output meshes having an oscillation frequency equal to half an angular input frequency of the pump signal,
wherein an output signal of the PFD can be switched between an in-phase state and an out-of-phase state.
2. The Ising machine of feature 1, wherein a characteristic of the nonlinear component is modulated at the angular input frequency of the pump signal.
3. The Ising machine of any of features 1-2, wherein the nonlinear component has a nonlinear reactance.
4. The Ising machine of feature 3, wherein the nonlinear component includes one or more of a diode, a varactor, or a combination thereof.
5. The Ising machine of feature 4, wherein the nonlinear component includes a varactor and an inductor, wherein the input mesh and the output mesh are coupled through the varactor and the inductor.
6. The Ising machine of any of features 1-5, wherein:
the input mesh includes an input filter to constrain the pump signal within the input mesh to the angular input frequency of the pump signal; and
the output mesh includes an output filter to constrain the output signal within the output mesh to half of the angular input frequency of the pump signal.
7. The Ising machine of any of features 1-6, wherein the output mesh is configured to series-resonate at half the angular input frequency of the pump signal.
8. The Ising machine of any of features 1-7, wherein each of the input mesh and the output mesh includes a resonator.
9. The Ising machine of feature 8, wherein each resonator includes one or more of an electrical resonator, a MEMS resonator, a NEMS resonator, an optical resonator, a non-Hermitian resonator, an electromagnetic resonator, or a combination thereof.
10. The Ising machine of feature 9, wherein the electrical resonator includes an LC tank.
11. The Ising machine of any of features 1-10, wherein the nonlinear component and the output mesh are configured as an electrical Mathieu Resonator having the nonlinear component, an intrinsic loss resistance of the PFD, and a load resistance of the PFD.
12. The Ising machine of any of features 1-11, wherein the threshold power of the pump signal is less than 1 μW.
13. The Ising machine of feature 12, wherein the threshold power of the pump signal is 600 nW or less.
14. The Ising machine of any of features 1-13, wherein the input mesh and the output mesh each form at least one of an electrical circuit, an integrated circuits, a microelectromechanical system (MEMS), a nano-electromechanical system (NEMS), an optical system, a non-Hermitian system, or a combination thereof.
15. An Ising system comprising:
a plurality of parametric frequency dividers (PFDs), each including:
a resonant input mesh driven by a pump signal;
a resonant output mesh coupled to the input mesh through a nonlinear component, and
the nonlinear component configured to passively activate, responsive to the pump signal exceeding a threshold power ($P_{th}$), a parametric oscillation between the input and output meshes having an oscillation frequency equal to half an angular input frequency of the pump signal,
a plurality of dissipative couplings, each connecting two or more of the output meshes of the plurality of PFDs;
wherein an output signal of each of the PFDs is switchable between an in-phase state and an out-of-phase state; and
wherein the pump signal exceeding the threshold power drives an oscillating spin coupling between at least one pair of PFDs connected by one of the dissipative couplings.
16. The Ising system of feature 15, wherein the nonlinear component and the output mesh of each PFD are configured as an electrical Mathieu Resonator having the nonlinear component, an intrinsic loss resistance of the PFD, a load resistance of the PFD, and half of a coupling resistance of the dissipative coupling connected to the output mesh.
17. The Ising system of feature 16, wherein the threshold power required for activation of the parametric oscillation in the out-of-phase state of the PFDs is less than the threshold power required for activation of the parametric oscillation in the in-phase state of the PFDs.
18. The Ising system of any of features 15-17, wherein a collective spin-configuration of the plurality of PFDs is indicative of a solution to a large-scale nondeterministic polynomial-time (NP) hard problem.
19. The Ising system of any of features 15-18, wherein a collective spin-configuration of the plurality of PFDs is indicative of a solution to a combinatorial optimization problem.
20. The Ising system of feature 19, wherein each variable of the combinatorial optimization problem is mapped to a specific one of the PFDs.
21. An Ising machine comprising:
two parametric oscillators driven by a pump signal and coupled through a series LC network;
the series LC network comprising two inductors and a microfabricated MEMS varactor, wherein the pump signal drives an oscillating spin coupling between the parametric oscillators at a resonance frequency, and wherein output signals of the parametric oscillators can be switched between an in-phase state and an out-of-phase state.
22. The Ising machine of feature 21, wherein the system provides a nonvolatile ferroelectric memory characterized by a shift of the resonance frequency resulting in a shift between in-phase output signals of the parametric oscillators, indicative of ferromagnetic interaction, and out-of-phase output signals of the parametric oscillators, indicative of anti-ferromagnetic interaction.
23. The Ising machine of any of features 21-22, wherein zero power is used to maintain the oscillating spin coupling.
24. The Ising machine of any of features 21-23, wherein not more than about 1 nanowatt of power is used to switch between the in-phase and out-of-phase output states.
25. A computation device comprising the Ising machine of feature 21.

A list of acronyms and variables referenced in this disclosure and their respective definitions is provided below:

| | |
|---|---|
| IM | Ising Machine |
| PFD | Parametric Frequency Divider |
| SHIL | Subharmonic Injection Locked |
| Q | Quality Factor |
| NP | Nondeterminisite Polynomial-time |
| COP | Combinatorial Optimization Problem |
| PFD IM | Parametric Frequency Divider-based Ising Machine |

-continued

| | |
|---|---|
| SHIL IM | Subharmonic Injection Locking-based Ising Machine |
| CIM | Coherent Ising Machine |
| SRAM | Static Random Access Memory |
| GPU | Graphics Processing Unit |
| OIM | Oscillator Ising Machine |
| FPGA | Field-Programmable Gate-Arrays |
| $\omega_0$ | Angular frequency of the output of PFDs |
| $P_{th}$ | Power Threshold |
| $\upsilon_{in}(t)$ | Input signal of PFDs |
| $\omega_{in}$ | Angular frequency of $\upsilon_{in}(t)$ which modulates the nonlinear capacitor in the PFDs |
| $\upsilon_{out}(t)$ | Output signal of PFDs |
| $\omega_{out}$ | Angular frequency of $\upsilon_{out}(t)$ |
| $R_L$ | Load resistance of PFDs or Mathieu's Resonators |
| MR | Mathieu Resonator |
| $\gamma_{tot}$ | Damping of the MR when also considering $R_L$ |
| $C_{av}$ | Capacitance of the nonlinear capacitance for $\upsilon_{in}(t)=0$ |
| $R_{tot}$ | Total resistance of the PFDs or MRs |
| $R_s$ | Intrinsic losses in the resonant system of the MR or PFD |
| R | Total resistance in the output mesh of PFDs |
| $R_d$ | Ohmic losses of the nonlinear capacitor |
| p | The depth of the resonance frequency modulation in $\upsilon_{in}(t)$ |
| $P^{th}$ | Threshold of the modulating signal that excites the subharmonic signal |
| N | Number of nodes |
| $\epsilon$ | Small-scale parameter |
| $G_{i,j}$ | Conductance coupling $MR_i$ to $MR_j$ at their outputs |
| $B_i(\tau)$ | Slow-varying complex amplitude term of $\upsilon_i$ |
| $\phi(\tau)$ | Phase of the complex amplitude of the MRs |
| $\Phi_i(\tau)$ | Phase of the complex amplitude of the i-th MR taken at the steady state |
| P | Probability-of-Success |
| $T_S$ | Time-to-solution |
| $PW_{spin}$ | Power-per-spin |
| $E_S$ | Energy-to-solution |
| G | Coupling matrix |
| A | Desired solution accuracy for P |
| GS | Ground-state |
| $P_{GS}$ | Probability-of-success for achieving GS |
| $P_A$ | Probability-of-success for achieving a solution that is within (1-A) % of the GS |
| $\tau_\phi$ | Time that it takes, on average, for the phases of the slow-varying complex amplitudes to reach their final value |
| $\tau_B$ | Relaxation time needed for the MRs to reach their steady-state amplitude values |
| $\tau_{ann}$ | Annealing rate |
| t | Elapsed time during the runs of the IM |
| pAG | Power Auxiliary Generator |
| $R_{AG}$ | Internal resistance of pAG |
| CV | Coefficient of Variation, describing the ratio between the standard deviation and the mean of a set |
| KVL | Kirchhoff's Voltage Law |
| KCL | Kirchhoff's Current Law |
| $\gamma_L$ | Damping of the MR due to losses in the load |
| $\tau$ | Slow time scale |
| $\upsilon_i$ | Voltage across the nonlinear capacitor |

BRIEF DESCRIPTION OF THE DRAWINGS

FIG. 9G illustrates numerically computed trends vs. Q of $E_S$ when N=40 for different values of $\tau_{ann}$.

FIG. 9H illustrates numerically computed trends vs. Q of $E_S$ when N=200 for different values of $\tau_{ann}$.

FIG. 9I illustrates numerically computed trends vs. Q of $E_S$ when N=400 for different values of $\tau_{ann}$.

FIGS. 13A-13I illustrate graphs and PFD output voltage waveforms for all nine Max-Cut problems attempted and correctly solved using the 4-node PFD IM of FIG. 12.

FIGS. 16A and 16B show that the HZO varactor of FIGS. 14A-14B exhibits two different capacitance values at 0 V in its two polarization states. These 0V capacitance values are marked with an upward pointing arrow and a downward pointing arrow to indicate whether they contribute to an fc that results in a ferromagnetic or anti-ferromagnetic interaction, respectively.

DETAILED DESCRIPTION

Provided herein are methods and systems for a new class of Oscillator Ising machines (OIMs) referred to as parametric frequency divider based IMs (PFD IMs). These PFD IMs rely on coupled parametric frequency dividers (PFDs) as macroscopic artificial spins. The PFDs disclosed herein rely on a nonlinear reactance, such as, for example, a diode or a varactor, to passively activate a parametric oscillation at half of their driving signal's natural frequency ($\omega_0$) when the input power levels exceed a certain threshold ($P_{th}$). Unlike existing parametrons, the PFDs provided herein couple a set of four harmonically related resonances to boost the effectiveness of the parametric modulation in their circuit, thereby enabling $P_{th}$ values that are orders of magnitude lower than existing parametrons. Additionally, unlike IM counterparts based on subharmonic-injection locking (SHIL), the PFD IMs described herein do not require strong injected continuous-wave signals or applied DC voltages.

Therefore, PFD IMs show a significantly lower power consumption per spin compared to SHIL-based IMs, making it feasible to accurately solve large-scale combinatorial optimization problems (COPs) that are hard or even impossible to solve by using the current von Neumann computing architectures. In particular, using high quality factor resonators in the PFD design results in the described PFD IMs achieving a nanoWatt-level power-per-spin. In addition, experimentation has shown that the described PFD IMs provide a significant a speed-up of phase synchronization among the PFDs, resulting in shorter time-to-solution and lower energy-to-solution despite using component resonators having a longer relaxation time than those used in some other IMs. As a proof of concept, a 4-node PFD IM has been demonstrated as described below. This 4-node PFD IM correctly solves a set of Max-Cut problems while consuming just 600 nanoWatts per-spin.

Figure 1A:
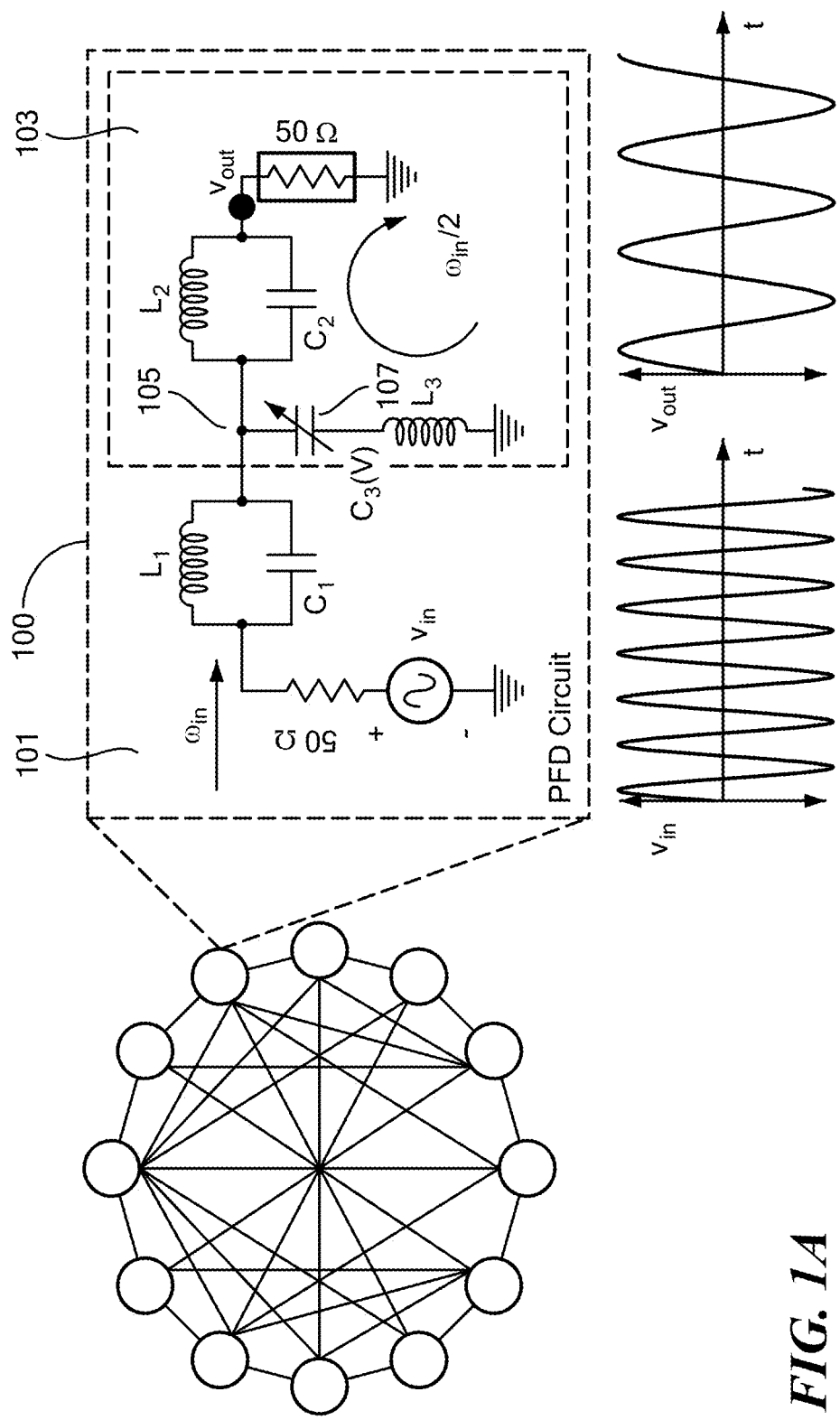
FIG. 1A illustrates a schematic view of a PFD Ising machine (IM) in accordance with various embodiments.

Referring now to FIG. 1A, a PFD 100 can be characterized by a resonant input mesh 101 and a resonant output mesh 103 coupled to the input mesh 101 through a nonlinear component 105. Although the PFDs are shown and described herein as including electrical circuits and using components such as LC tanks, varactors, inductors, resistors, and the like on PCBs, it should be understood that PFDs 100 in accordance with various embodiments can include any combination of components of any type wherein the combination is configured to passively receive an input signal having an input frequency ($F_{in}$) and generate a subharmonic output signal ($F_{out}$), preferably such that $F_{out}=F_{in}/2$. For example, depending on the application, the input mesh 101 and the output mesh 103 can be formed as circuit meshes (e.g., as shown and described herein) but can also be formed as integrated circuits, MEMS, NEMS, optical systems, non-Hermitian systems, combinations thereof, or any other suitable component or combination of components. The input mesh 101 and the output mesh 103 can also include any suitable resonator or resonators, including, for example, electrical resonators (whether provided via conventional circuitry and/or IC circuitry), MEMS resonators, NEMS resonators, LC tanks, optical resonators, non-Hermitian resonators, electromagnetic resonators, or combinations thereof. In addition, the nonlinear component 105, in accordance with various embodiments, can include any component or combination of components having appropriate nonlinear properties such as, for example, a diode, a varactor, or combinations thereof.

As shown in FIG. 1A, PFDs 100 can be provided as a two-port electrical network formed by two circuit meshes 101, 103 interconnected through a shunt branch 105 containing a nonlinear capacitor 107. The input mesh 101 is driven by the PFD's input signal [$v_{in}(t)$], which modulates the capacitance of the nonlinear capacitor at an angular frequency $\omega_{in}$. Each mesh incorporates a set of notch filters. These filters constrain $\upsilon_{in}(t)$ and the output signal, $\upsilon_{out}(t)$ within the PFD's input and output meshes, respectively, allowing to analyze the PFD's behavior at each frequency by examining just one mesh. The reactive components in the output mesh of a PFD 100 are selected to series-resonate at half of the input natural frequency (e.g., $\omega_{in}=2\omega_0$ when neglecting the capacitance modulation induced by $\upsilon_{in}(t)$. This permits a mapping of the PFD's operation at or near $\omega_0$ with only one second-order differential equation describing the voltage across the nonlinear capacitor. This mapping is equivalent to an electrical realization of a Mathieu resonator (MR, see FIG. 1B). Such an MR has a Q equal to $1/(2\gamma_{tot})$, where $\gamma_{tot}$ models the resonator's damping (e.g., $\gamma_{tot}=\omega_0 C_{av} R_{tot}/2$ where $C_{av}$ is the average capacitance of the nonlinear capacitor for $\upsilon_{in}(t)=0$. $R_{tot}$ is equal to $R_L+R_S$, where $R_S$, denotes the intrinsic losses in the resonant system (e.g., the total resistance in the PFD's output mesh, R, combined with the resistance, $R_d$, capturing the ohmic losses in the nonlinear capacitor's electrodes and dielectric film). Also, the MR has a resonance angular frequency in the absence of modulation equal to $\omega_0$, and this frequency is periodically varied at a rate equal to $\omega_{in}$. In this regard, the magnitude of the resonance frequency modulation caused by the input signal at $\omega_{in}$ is denoted as p. As in its mechanical counterpart, the MR describing the operation of a PFD enters a period-doubling regime for p-values larger than a certain threshold ($P_{th}$) equal to $4\gamma_{tot}$.

Modeling PFDs as Mathieu's Resonators

Starting from the PFD's electrical circuit shown in FIG. 1A, the PFD's behavior at or near $\omega_0$ can be described by a single resonant branch capturing the behavior of the PFD's output mesh around $\omega_0$. This resonant branch is formed by the series of L, C(t), and $R_{tot}$ and it conforms to the structure of an electrical MR with total damping proportional $R_{tot}$. The behavior of this circuit can be analyzed by studying its corresponding Kirchhoff's Voltage Law (KVL) equation in terms of the voltage (v) across the MR's nonlinear capacitor (see Eq. (1)):

$$LC(t)\ddot{\upsilon}+\upsilon+\epsilon R_{tot} C_{av} \dot{\upsilon}=0. \quad (1)$$

In Eq. (1), $C_{av}$ maps the average capacitance of the PFD's nonlinear capacitor during the period of the input signal ($T_{in}=2\pi/\omega_{in}$). Also, a small expansion parameter ($\epsilon$) is used to scale the value of $R_{tot}$. In this regard, Eq. (1) has been truncated at the first order of $\epsilon$ (e.g., $\epsilon^2=0$, $\epsilon^3=0$). Bearing in mind that $\omega_0^2=1/LC_{av}$, Eq. (1) can be rewritten as:

$$\ddot{\upsilon}+\omega_{out}^2 \epsilon R_{tot} C_{av} \dot{\upsilon})=0. \quad (2)$$

By expressing $\omega_{out}^2$ as shown in Eq. (14) below, defining $\gamma_{tot}$ as $\omega_{out} C_{av} R_{tot}/2$ and once again disregarding terms proportional to higher powers of $\epsilon$, Eq. (2) can be represented as follows:

$$\ddot{\upsilon}+\omega_0 \epsilon 2\gamma_{tot}\dot{\upsilon}+\omega_0^2[1+\epsilon p(1-\beta(\upsilon)^2)\sin(2\omega_0 t)]\upsilon=0 \quad (3)$$

The Multiple Scale Method (MSM) can now be applied. In order to do so, start by separating the fast- and slow-changing timescales of $\upsilon$ as $\upsilon=\upsilon^{(0)}+\epsilon\upsilon^{(1)}$, where $\upsilon^{(0)}$ and $\upsilon^{(1)}$ are the zeroth-order and first-order terms of v, respectively. Also, rewrite the time derivatives as $d/dt=D_0+\epsilon D_1$, and $d^2/dt^2=D_0^2+2\epsilon D_0 D_1$ where $D_0=\partial/\partial t$ and $D_1=\partial/\partial\tau$. Accordingly, Eq. (3) can be rewritten as:

$$D_0^2 \upsilon^{(1)} + 2\epsilon D_0 D_1 \upsilon^{(0)} + \epsilon D_0^2 \upsilon^{(1)} + 2\epsilon\omega_0 \gamma_{tot}[D_0 \upsilon^{(0)} + \epsilon D_0 \upsilon^{(1)} + \epsilon D_1 \upsilon^{(0)}] \quad (4)$$

$$\omega_0^2 \upsilon^{(0)} + \omega_0^2 \epsilon \upsilon^{(1)} + \omega_0^2 \epsilon p(1-\beta \upsilon^2)\sin(2\omega t)\upsilon^{(0)} = 0$$

By retaining only the terms proportional to $\epsilon$, Eq. (4) can be written as:

$$D_0^2 \upsilon^{(1)} + \omega_0^2 \upsilon^{(1)} + 2D_0 D_1 \upsilon^{(1)} + \quad (5)$$

$$2\omega_0 \gamma_{tot} D_0 \upsilon^{(0)} + \omega_0^2 p(1-\beta \upsilon^2)\sin(2\omega t)\upsilon^{(0)} = 0$$

Given that the zeroth-order of the voltage across the MR's capacitor is expected to vary at a rate equal to $\omega_0$, the lowest order response of v can be rewritten as $\upsilon^{(0)}=B(\tau)e^{i\omega_0 t}+B^*(\tau)e^{-i\omega_0 t}$, where $B(\tau)^*$ is the complex conjugate of $B(\tau)$. In the following, $B(\tau)$ and $B(\tau)^*$ are be referred to simply as B and B* respectively. Eq. (5) can then be rewritten as:

$$D_0^2 \upsilon^{(1)} + \omega_0^2 \upsilon^{(1)} + 2D_0 D_1 B e^{i\omega_0 t} + \quad (6)$$

$$2\omega_0 \gamma_{tot} D_0 B e^{i\omega_0 t} + +\omega_0^2 p(1-\beta \upsilon^2)\sin(2\omega t) B e^{i\omega_0 t} + c.c. = 0$$

In Eq. (6), c.c. denotes the complex conjugate of all the terms in Eq. (6) proportional to $e^{i\omega_0 t}$. Eq. (6) can be further simplified as:

$$i\omega_0 e^{i\omega_0 t}[2\partial B/\partial\tau + 2\omega_0 \gamma_{tot} B - i\omega_0 p(1-\beta \upsilon^2)\sin(2\omega t)B] + \quad (7)$$

$$D_0^2 \upsilon^{(1)} + \omega_0^2 \upsilon^{(1)} + c.c. = 0$$

In Eq. (7), the terms proportional to $e^{i\omega_0 t}$ include of group of secular terms that would make the solution of $\upsilon^{(1)}$ unbounded if their sum was not equal to zero, which is not possible considering the nature of the problem being solved. In other words, the expression multiplying $e^{i\omega_0 t}$ in Eq. (7) must be equal to zero, and this offers the opportunity to retrieve a first-order differential equation in terms of B that can be used to compute the real and imaginary parts of B, namely $B_R$ and $B_I$, respectively as in Eq. (8):

$$B'=\frac{1}{4}[(\omega_0 p\beta)(B^3-3BB^{*2})+\omega_0 pB^*-4\omega_0\gamma_{tot}B \quad (8)$$

The stability of a single MR can be directly analyzed from Eq. (8). In order to do so, the real and imaginary parts of B are separate by rewriting B as $B_R+iB_I$. This allows Eq. (8) to be rewritten as a system of two decoupled first-order differential equations, Eqs. (9) and (10) in the variables $B_R$ and $B_I$:

$$\frac{\partial B_R}{\partial \tau} = B_R[p/4 - p\beta/2(B_R^2 + 3B_I^2) - \gamma_{tot}]\omega_0, \quad (9)$$

$$\frac{\partial B_I}{\partial \tau} = B_I[-p/4 + p\beta/2(B_I^2 + 3B_R^2) - \gamma_{tot}]\omega_0 \quad (10)$$

From Eqs. (9) and (10), the Jacobian matrix can be computed relative to the system of equations in Eqs. (9) and (10) as:

$$J = \begin{pmatrix} J_{11} & J_{12} \\ J_{21} & J_{22} \end{pmatrix}, \quad (11)$$

where: $J_{11} = (p/4 - 3p\beta|B|^2/2 - \gamma_{tot})\omega_0$, $J_{12} = -3p\omega_0\beta B_I B_R$, $J_{21} = 3p\omega_0\beta B_R B_I$, $J_{22} = (-p/4 + 3p\beta|B|^2/2 - \gamma_{tot})\omega_0$.

Finally, the stability of the trivial solution can be studied by extracting the eigenvalues ($\lambda\pm$) of J after linearizing it around ($B_R=0$, $B_I=0$). $\lambda\pm$ are found to be:

$$\lambda\pm=(-4\gamma_{tot}\pm p)\omega_0/4. \qquad (12)$$

From Eq. (12) it can be determined that $\lambda_+$ becomes equal to zero for $p=p_{th}=4\gamma_{tot}$, marking the transition to a nontrivial period-doubling regime.

Modeling a System of Coupled PFDs

Figure 1B:
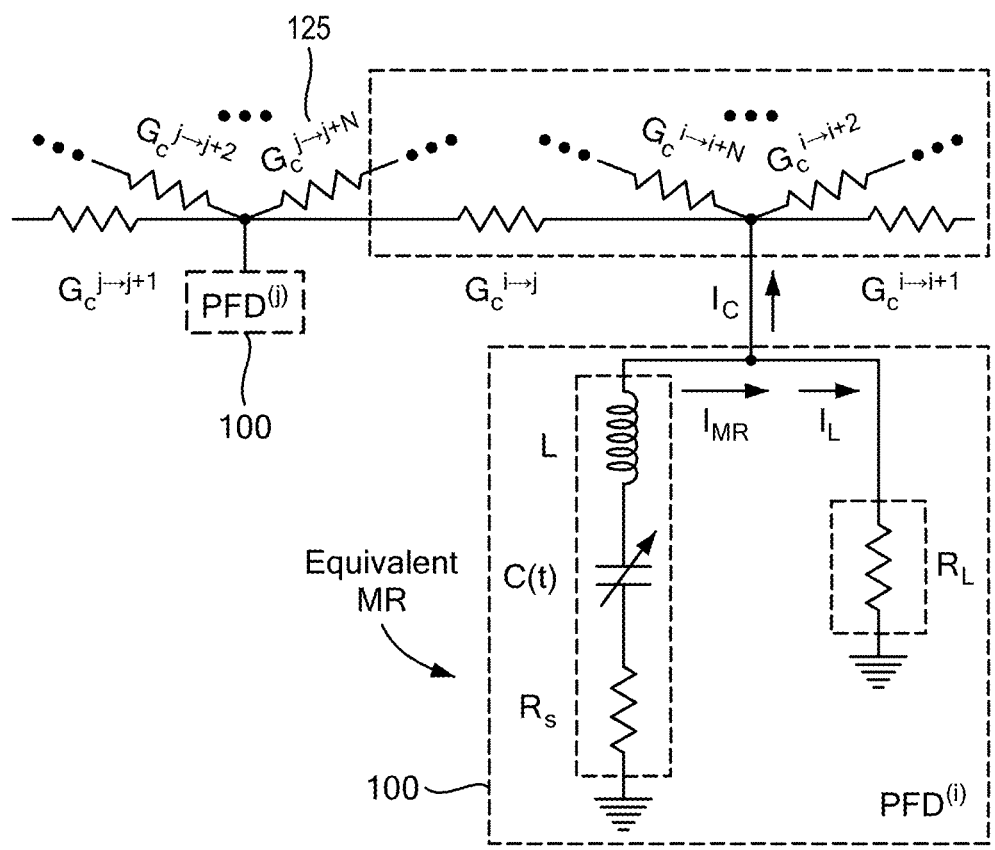
FIG. 1B illustrates a schematic view of a network of coupled PFDs, where each PFD is described by an electrical Mathieu resonator (MR).

Referring now to FIG. 1B, in order to demonstrate that networks of PFDs 100 can be used as IMs, their interacting dynamics when they are coupled are analyzed, particularly the interacting dynamics of coupled MRs. This can be done by considering a number (N) of MRs with the same Q and $\omega_0$ values, and all couplings 125 among the MRs are assumed to be purely dissipative (e.g., the PFDs 100 are coupled through resistors 125 connected to their output meshes 103). To this end, small coupling conductances ($\epsilon G_{i,j}$) with generic indices i and j can be used to map the interaction between the generic i-th and j-th MRs, as shown in FIG. 1B. In particular, a summation can be used to capture all the interactions that any given MR is subject to based on the targeted problem to be solved.

As an example, Eq. (13) below is the MR-equation used to analyze the dynamics of the i-th MR during analysis. The variables $\upsilon_{i,j}$ in Eq. (13) describe the voltage across the nonlinear capacitors in the i-th and j-th MRs, respectively.

$$\ddot{\upsilon}_i+2\epsilon\gamma_{tot}\omega_0\dot{\upsilon}_i+\omega_{out}^2\upsilon_i+2\gamma_L\omega_0 R_L\Sigma_{j\neq i}\epsilon G_{ij}\dot{\upsilon}_j=0 \qquad (13)$$

Different from the equation of motion of a single PFD as above, Eq. (13) includes an additional damping parameter, $\gamma_L$, equal to $\omega_0 C_{av} R_L/2$. The angular resonance frequency for all MRs incorporates a "pump-depletion" term proportional to $\beta$ Eq. (14)] that is responsible for the saturation of the voltage across their nonlinear capacitors for $p > p_{th}$.

$$\omega_{out}^2=\omega_0^2[1+\epsilon p(1-\beta(\upsilon_i)^2)\sin(2\omega_0 t)]. \qquad (14)$$

The inventors note that in Eqs. (13) and (14) both p and $\gamma_{tot}$ are assumed to be small and are consequently scaled by a small parameter $\epsilon$. From Eqs. (13) and (14), the Multiple Scales Method can be applied to derive a system of first-order differential equations, provided in Eq. (23) below, which governs the dynamics of the complex voltage amplitude for the slow time scale $\tau=\epsilon t$. For the derivation of Eq. (23), the lowest order response of vi is assumed to be expressible as $B_i(\tau)e^{-i\omega_0 t}+B_i^*(\tau)e^{-i\omega_0 t}$ where $B_i^*(\tau)$ is the complex conjugate of $B_i$. Also, when MRs are used to solve a COP, the solution is expected to be encoded in the phase [$\phi(\tau)$] of the complex amplitude reached at steady state by all the adopted MRs, similarly to what happens in CIMs and SHIL IMs. Therefore, from the real [$B_{i,re}(\tau)$] and imaginary [$B_{i,im}(\tau)$] parts of $B_i(\tau)$, $\phi_i(\tau)$ can be calculated as arctan [$B_{i,im}(\tau)/B_{i,re}(\tau)$]. Then, the steady-state value ($\Phi_i$) of $\phi i(\tau)$ is evaluated and the same procedure is run for all the adopted MRs. Independently of the problem that needs to be solved, each MR can only reach two $\Phi$-values, namely 0 or $\pi$, giving each PFD in a PFD IM the ability to passively emulate the dynamics of an Ising spin. In this regard, similar to CIMs that utilize parametric dynamics to achieve phase bistability in the optical domain, the ground-state solution identified by a PFD IM corresponds to the collective spin-configuration that is first activated once the PFDs' input signal is turned on and it is increased beyond the stability region of the non-dividing trivial solution.

This computational principle is fundamentally different from that of SHIL IMs, whose oscillators exhibit phase dynamics governed by a scalar Lyapunov function that is equivalent to the Ising Hamiltonian under a change of variables.

Continuing the analysis with reference to the architecture illustrated in FIG. 1B, Kirchhoff's Current Law (KCL) can be applied at the central node of the ith-MR, giving:

$$i_{MR}^{(i)}=i_{R_L}^{(i)}+\Sigma_{j\neq i}i_c^{(i,j)} \qquad (15)$$

Assuming that the coupling conductances are significantly smaller than $1/R_L$, the final term on the right-hand side of Eq. (15) can be regarded as the accumulation of small fractions of $I_{MR}^{(i)}$ that flow towards the other MRs connected to the ith-MR. In this scenario, $$\Sigma_{j\neq i}i_c^{(i,j)}$$

can be simplified as:

$$\Sigma_{j\neq i}i_c^{(i,j)}=R_L C_{av}\Sigma_{j\neq i}\epsilon G_{ij}\dot{\upsilon}_j. \qquad (16)$$

By using Eq. (16) and by applying KVL to the MR circuit shown in FIG. 1B:

$$LC(t)\ddot{\upsilon}_i + \upsilon_i + \epsilon R_{tot}C_{av}\dot{\upsilon}_i \qquad (17)$$

$$R_L^2 C_{av}\sum_{j\neq i}\epsilon G_{ij}\dot{\upsilon}_j = 0$$

By recalling that $\omega_{out}^2(t)$ equals $1/[LC(t)]$, Eq. (17) can be further simplified as:

$$\ddot{\upsilon}_i + \omega_{out}^2\epsilon R_{tot}C_{av}\dot{\upsilon}_i + \omega_{out}^2\upsilon_i + \omega_{out}^2 R_L^2 C_{av}\sum_{j\neq 1}\epsilon G_{ij}\dot{\upsilon}_J = 0 \qquad (18)$$

By setting $\gamma_{tot}$ and $\gamma_L$ equal to $\omega_{out}C_{av}R_{tot}/2$ and $\omega_{out}C_{av}R_L/2$ respectively, rewriting $\omega_{out}^2$ using Eq. (14), and neglecting the higher order terms of c once again, Eq. (18) can be rewritten as:

$$\ddot{\upsilon}_i + \omega_0^2\big[1 + \epsilon p\big(1 - \beta\upsilon_i^2\big)\sin(2\omega_0 t)\big]\upsilon_i + \qquad (19)$$

$$\omega_0\epsilon 2\gamma_{tot}\dot{\upsilon}_i + \omega_0 2\gamma_L R_L\sum_{j\neq i}\epsilon G_{ij}\dot{\upsilon}_J = 0$$

As above, $\epsilon$ is treated as a small expansion parameter and only the terms that are at the order of $\epsilon$ are considered. For the dynamics of $\upsilon_i$, the quickly varying timescale is separated from the slowly varying one, thereby expressing $\upsilon_i$ as $\upsilon_i^{(0)}+\epsilon\upsilon_i^{(1)}$, where $\upsilon_i^{(0)}$ and $\upsilon_i^{(1)}$ are the zeroth-order and first-order expansions of $\upsilon_i$, respectively. Also, as done above for the analysis of the single MR, the time derivatives can be rewritten as $d/dt=D_0+\epsilon D_1$, and $d^2/dt^2=D_0^2+2\epsilon D_0 D_1$, where $D_0=\partial/\partial t$ and $D_1=\partial/\partial\tau$. This allows Eq. (19) to be rewritten as:

$$D_0^2\upsilon_i^{(1)} + \omega_0^2\upsilon_i^{(1)} + 2D_0 D_1\upsilon_i^{(0)} + 2\omega_0\gamma_{tot}D_0\upsilon_i^{(0)} + \qquad (20)$$

$$\omega_0^2 p\big(1 - \beta\upsilon_i^2\big)\sin(2\omega t)\upsilon_i^{(0)} + 2\omega_0\gamma_L R_L\sum_{j\neq i}D_0 G_{ij}\upsilon_j^{(0)} = 0$$

Due to the nature of the problem being analyzed, it is expected that the lowest-order response of $\upsilon_i$ to vary at a rate equal to $\omega_0$. As a result, $\upsilon_i^{(o)}$ can be rewritten as $B_i(\tau)e^{i\omega_0 t}+B_i^*(\tau)e^{-i\omega_0 t}$, where $B_i^*(\tau)$ is the complex conjugate of $B_i(\tau)$. This Eq. (20) to be rewritten as:

$$D_0^2 v_i^{(1)} + \omega_0^2 v_i^{(1)} + 2D_0 D_1 B_i e^{i\omega_0 t} + 2\omega_0 \gamma_{tot} D_0 B_i e^{i\omega_0 t} + \quad (21)$$

$$\omega_0^2 p(1 - \beta v_i^2) \sin(2\omega t) B_i e^{i\omega_0 t} + 2\omega_0 \gamma_L R_L \sum_{j \neq i} D_0 G_{ij} B_j e^{i\omega_0 t} + c.c. = 0$$

where, for simplicity, B(τ) and B(τ)* are being written as B and B* respectively. In Eq. (21), the terms proportional to $e^{-i\omega_0 t}$, which are the complex-conjugate of the terms proportional to $e^{i\omega_0 t}$, are lumped into the term "c.c.". Eq. (21) can then be rewritten as:

$$i\omega_0 e^{i\omega_0 t} \left[ 2\partial B_I / \partial \tau + 2\omega_0 \gamma_{tot} B_i - i\omega_0 p(1 - \beta v_i^2) \sin(2\omega t) B_i + \quad (22) \right.$$

$$\left. 2\omega_0 \gamma_L R_L \sum_{j \neq i} D_0 G_{ij} B_j \right] + D_0^2 v_i^{(1)} + \omega_0^2 v_i^{(1)} + c.c. = 0$$

Just like in the single-MR case, the term multiplied by $e^{i\omega_0 t}$ must be equal to zero. This enables derivation of the first-order differential equation of Eq. (22), which can be used to calculate the real and imaginary components of $B_i$. From Eq. (22), it is possible to compute the solution for any targeted combinatorial optimization problem by determining the steady-state phase value (Φ) for all the MRs used to map it:

$$B_i'(\tau) = \quad (23)$$

$$\frac{1}{4}\left[(p\omega_0\beta)(B_i^3 - 3B_i B_i^{*2}) + p\omega_0 B_i^* - 4\omega_0 B_i \gamma_{tot} - 4\omega_0 R_L \gamma_L \sum_{j \neq i} G_{ij} B_j \right]$$

To model noise in the system, the Brownian thermally generated white noise voltages produced by each resistor were mapped as a Wiener process in the system of MR-equations. This is the same approach has been used to capture the effect of noise during the analysis of SHIL IMs through the Kuramoto model.

Starting from Eq. (23), it is possible to evaluate the performance of a PFD IM when computing the solution of a COP over N variables, with each variable mapped to a specific PFD. In this regard, the performance of IMs are assessed based on several factors, including the probability of achieving a spin configuration that matches or closely matches the problem solution, referred to as the "probability-of-success" (P), the time required to obtain a solution, referred to as the "time-to-solution" $T_S$, the power consumption of each spin, referred to as the "power-per-spin" ($PW_{spin}$), and the energy consumed by the entire machine during the computation, referred to as the "energy-to-solution" ($E_S$). In order to evaluate these computing performance metrics for the PFD IMs, a specific coupling matrix [G], is constructed for each problem, with dimension N×N. Each row of [G] incorporates the conductance used to couple one specific PFD to any other PFDs. For each PFD, the phase of the slow complex amplitude, provided in Eq. (23), of its corresponding equivalent MR equation is numerically computed to obtain Φ. Then, P is determined based on a desired accuracy level (A). A is the minimum tolerated accuracy for the problem solution and its value ranges from 0 to 100%. Depending on whether examination is of a probability to reach the ground-state (e.g., the global minimum for the targeted COP that identifies a 100% accurate solution) or of a probability to reach a close enough solution to the ground-state, with an accuracy higher than A but lower than 100%, P can be re-written as $P_{GS}$ or $P_A$, respectively. Both $P_{GS}$ and $P_A$ can be computed for any targeted problem by solving it multiple times. After determining $P_A$, $T_S$ can be calculated as:

$$T_S = \tau_\phi \times [\log_{(1-P_A)}(A)] \quad (24)$$

where $\tau_\phi$ is the time that it takes on average for the phases of the slow-complex amplitudes of all coupled MRs to reach their final value when multiple problem-runs are executed. It is worth mentioning that the achievement of optimal computing performance can pass through the adoption of an annealing step, similarly to prior SHIL IMs. To this end, p is gradually increased up to $1.005p_{th}$ from an initial value equal to $0.99p_{th}$ following an exponential trend, e.g., p(t)= $p_{th}(0.99+0.015(1-e^{-t/\tau_{ann}}))$, where $\tau_{ann}$ is the annealing rate and t is the time. After determining $T_S$, bearing in mind that p reflects the voltage magnitude at $\omega_{in}$ across the varactor in each PFD and that $P_{th}$ is proportional to $p_{th}^2$, $E_S$ can be estimated for any problem as $N \cdot P_{th} \int_0^{T_S} (0.99+0.015(1-e^{-t/\tau_{ann}}))^2 dt$. The $P_{th}$ value considered during the computation of $E_S$ can be directly found through a circuit simulation of a PFD.

PFDs' Design

Figure 2A:
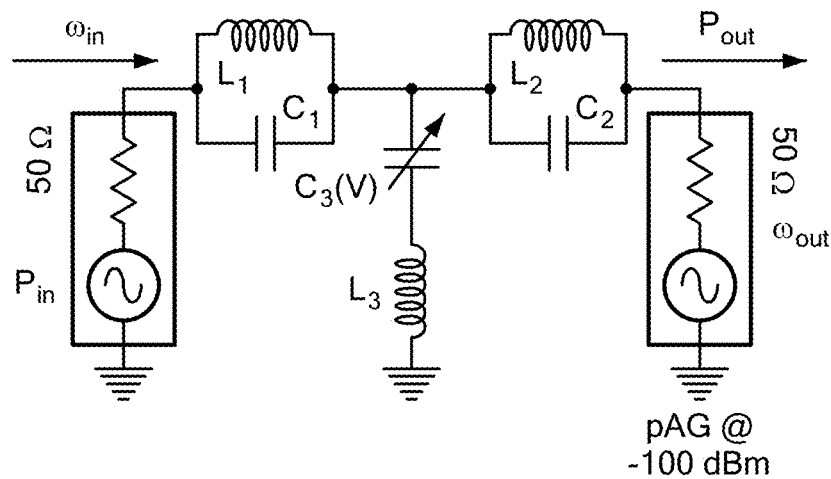
FIG. 2A illustrates a circuit schematic of a PFD implementing a power auxiliary generator technique for detection of subharmonic instability and for evaluation of the circuit's response for input power levels exceeding the power threshold.

Since the $PW_{pin}$ value of a PFD IM closely corresponds to the $P_{th}$ value of the constituent PFDs, it is crucial to design the PFDs in a manner that permits the attainment of the lowest possible $P_{th}$ value. In order to do so, the PFDs' components must be selected such that i) the series of $L_2$, $C_2$, $L_3$, and $C_3$ series-resonate at too; ii) the series of $L_1$, $C_1$, $L_3$, and $C_3$ series-resonate at on iii) $L_1$ and $C_1$ behave as a band-stop filter at $\omega_0$; and iv) $L_2$ and $C_2$ behave as a band-stop filter at $\omega_{in}$. Starting from these design conditions, the PFDs (see FIG. 2A) were selected through a numeric optimization routine run in a commercial circuit simulator. Through this design step, the following off-the-shelf components were identified: $C_3$: Model n.SMV1236-079LF (26.75 pF, tuning range=36%), $L_1$: Model n.1812LS334XLJC (330 µH), $L_2$: Model n.1812LS-474XLJC (470 µH), $L_3$:Model n.1812LS-334XLJC (330 µH), $C_1$: Model n.GRM1555C1H750JA01 (75 pF), and $C_2$: Model n.GRM1555C1R70WA01 (0.7 pF).

Circuit Simulation of PFDs

Figure 2B:
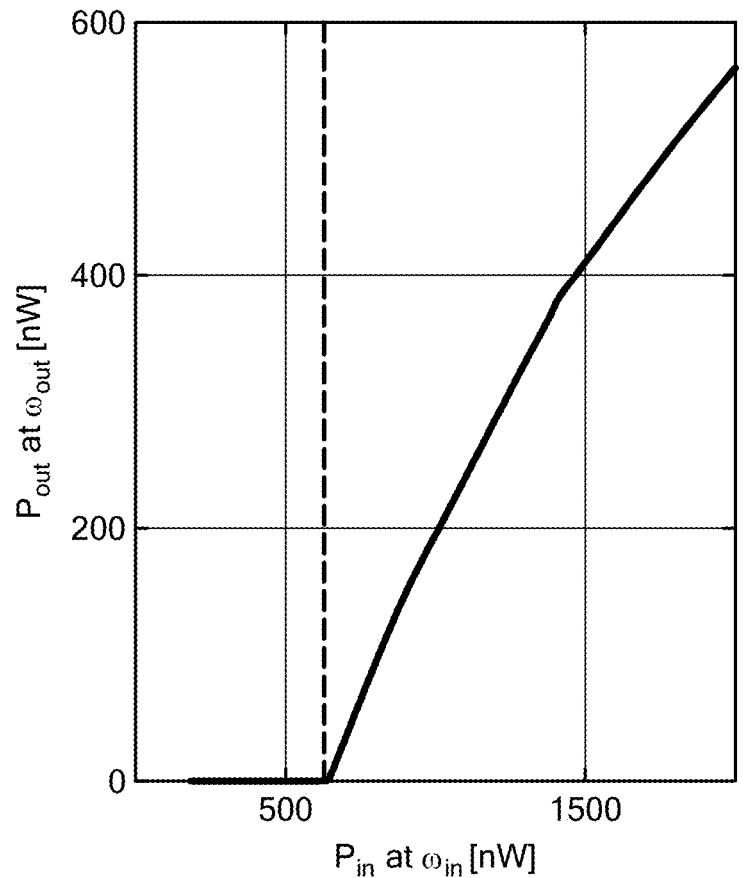
FIG. 2B illustrates a simulated $P_{out}$ vs. $P_{in}$ curve for the PFD employed in the PFD IM of FIG. 2A.

Most commercial circuit simulators struggle to detect parametric instabilities, leading to difficulties in designing parametric circuits with optimal performance. Various simulation approaches have been proposed, each with its own challenges and shortcomings. In particular, time-domain simulations often don't converge in the presence of points of marginal stability, like the Hopf bifurcations exhibited by parametric circuits during the activation of a period-doubling regime. In contrast, frequency-domain techniques like Harmonic Balance (HB) are frequently used due to their fast computation time, even when analyzing complex nonlinear circuits. However, commercial HB simulators are unable to detect subharmonic oscillations because they assume that only the input signal's frequency or its harmonics can be generated by any circuits, thus being inherently unable to detect parametrically generated subharmonic oscillations. The power auxiliary generator (pAG) technique has only recently been introduced to overcome this limit. This technique forces HB simulators to also consider the frequencies that are subharmonic of the input signals' frequencies, enabling the detection of subharmonic oscillations. A pAG is a power generator operating at $\omega_{out}$ characterized by an internal resistive impedance, $R_{AG}$. The generator is connected to the circuit on behalf of the circuit's load, $R_L$, and $R_{AG}$ is set to be equal to $R_L$. Meanwhile, the generator is configured to deliver a power level that is comparable to the noise level in the circuit, ensuring that the pAG does not alter the operating point of any nonlinear components (see FIG. 2A). At the same time, since the pAG is inserted on behalf of $R_L$ and $R_{AG}$ is equal to $R_L$, the introduction of the pAG in the circuit does not perturb the impedance seen by the nonlinear components at any frequency. This makes sure that the nonlinear dynamics of the circuit with the pAG match exactly those of the original circuit with $R_L$. The adoption of the pAG technique enables determination of the PFDs' optimal components, and visualization of the PFDs' electrical response for input power levels higher than $P_{th}$. This was easily done by calculating the power delivered to $R_{AG}$. In this regard, FIG. 2B reports the simulated $P_{out}$ vs. $P_{in}$ trend at $\omega_{out}$ for the assembled PFDs. As illustrated in FIG. 2B, this trend shows the presence of a supercritical bifurcation for $P_{th}$ approximately equal to 600 nW, above which a significant $P_{out}$ is delivered to $R_{AG}$. Thanks to the fact that the selected annealing schedule requires driving each PFD with a power level that exceeds $P_{th}$ by a mere 0.5%, the $Pw_{spin}$ value of PFD IMs can be approximated as the $P_{th}$ value of a single PFD.

Furthermore, the ability to passively generate Ising dynamics without active components allows the Johnson noise generated by the MRs' resistors to be considered as the only noise process affecting the MRs' circuit.

To analyze and benchmark the performance of PFD IMs, all the PFDs were connected in a Möbius ladder configuration and a set of unweighted Max-Cut problems of varying sizes were solved. COPs with a Möbius ladder graph are considered low-complexity sparse problems. Nonetheless, their correct solution can be numerically calculated, allowing easy verification of whether the solution found by a PFD IM is correct and, if it is not correct, to evaluate the difference in the computed number of cuts with respect to the expected value. The number of cuts computed by a PFD IM is equivalent to the total number of paths of the problem-graph connecting PFDs with different output phases.

Figure 3A:
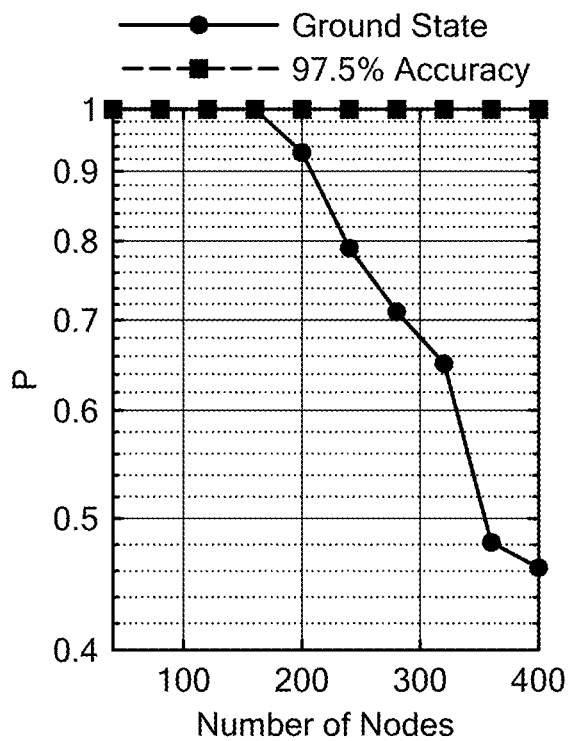
FIG. 3A illustrates numerically computed trends of $P_{GS}$ and $P_{97.5\%}$ vs. increasing N in Möbius ladder problems.
Figure 3B:
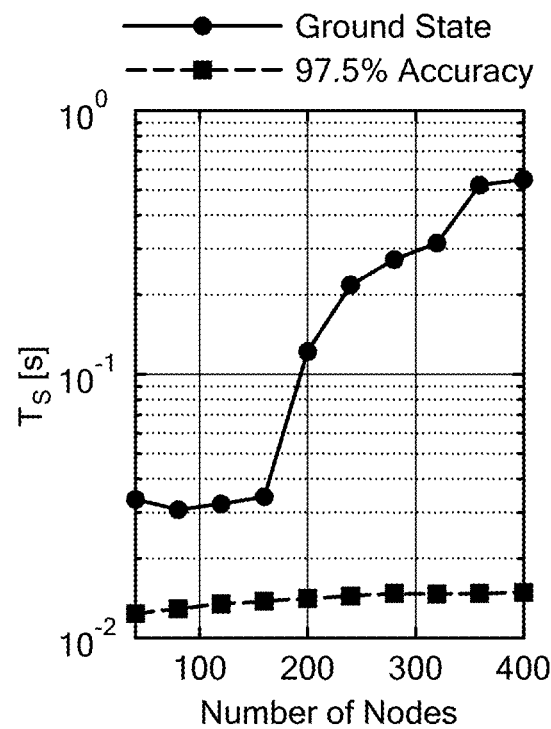
FIG. 3B illustrates numerically computed trends of $T_S$ for A=97.5% or A=100% vs. increasing N in Möbius ladder problems.
Figure 3C:
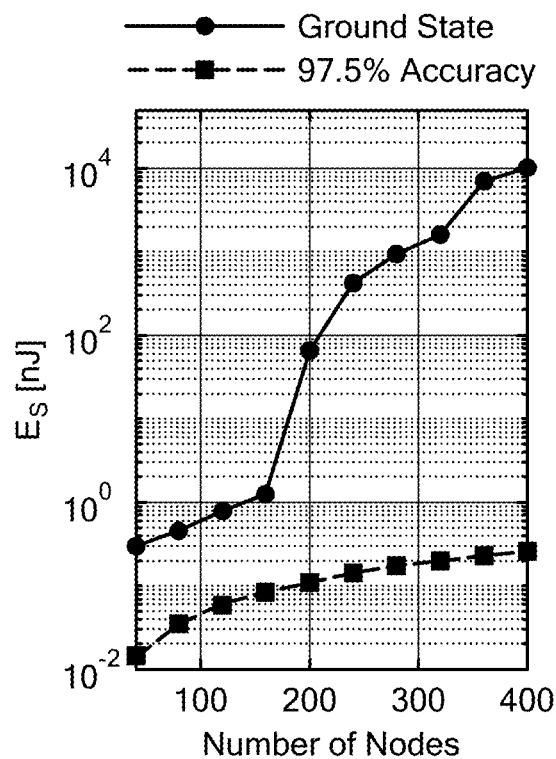
FIG. 3C illustrates numerically computed trends of $E_S$ for A=97.5% or A=100% vs. increasing N in Möbius ladder problems.

By relying on the analytical model presented herein, $P_A$, $T_S$, and $E_S$ were first investigated when scaling N in the graph from 40 to 400 and when assuming specific values of tolerated accuracy (A=100% and A=97.5%) frequently used for benchmarking IMs. During this study, a Q value equal to 50 was initially considered, which is approximately the same Q of the resonators used by the PFDs that were assembled. Also, a value equal to $2\pi \times 10^6$ rad/sec was assumed, which coincides with the output angular frequency of the assembled PFD IM. For each considered N value, the problem solution was calculated 100 times. This allowed determination of $P_{GS}$ and $P_{97.5\%}$ (see FIG. 3A), together with the number of cuts identified by each executed problem-run. It was found that the likelihood of generating a 100% accurate solution rapidly decays with respect to N, which is in line with what is generally observed in other IMs. Nevertheless, PFD IMs retain a 100% likelihood of calculating a cut-size within 2.5% of the highest possible number of cuts. In addition, after identifying $\tau_\phi$, $T_S$ and $E_S$ vs. N were calculated when assuming a 100% or a 97.5% accuracy (see FIGS. 3B and 3C). In this regard, during the calculation of $E_S$, a $P_{th}$ value (600 nW) was assumed, matching what was simulated and experimentally measured. As shown in FIGS. 3B and 3C, an $E_S$ value of 10 µj (0.26 nJ) was found when assuming a 100% (97.5%) minimum tolerated accuracy in the calculation of $T_S$.

Figure 4A:
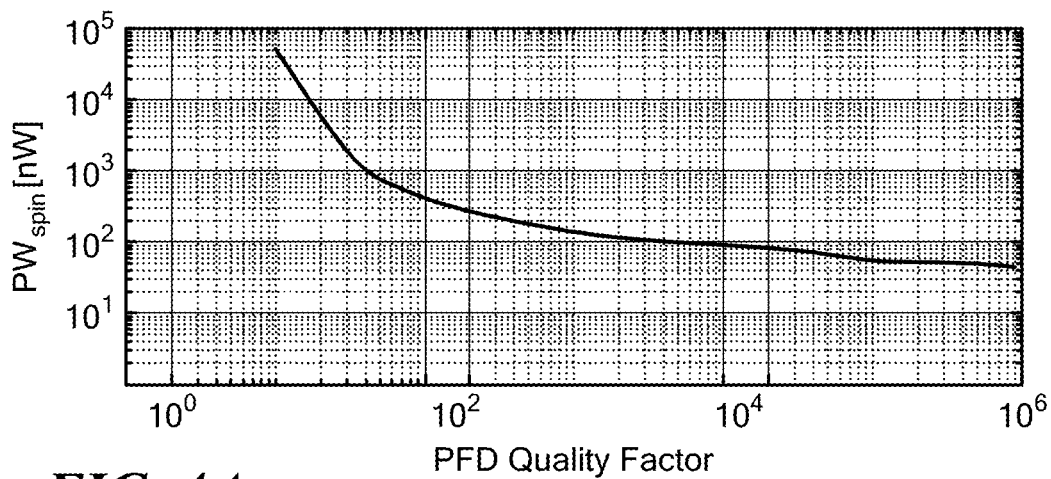
FIG. 4A illustrates numerically computed trends vs. Q of $PW_{spin}$.
Figure 4B:
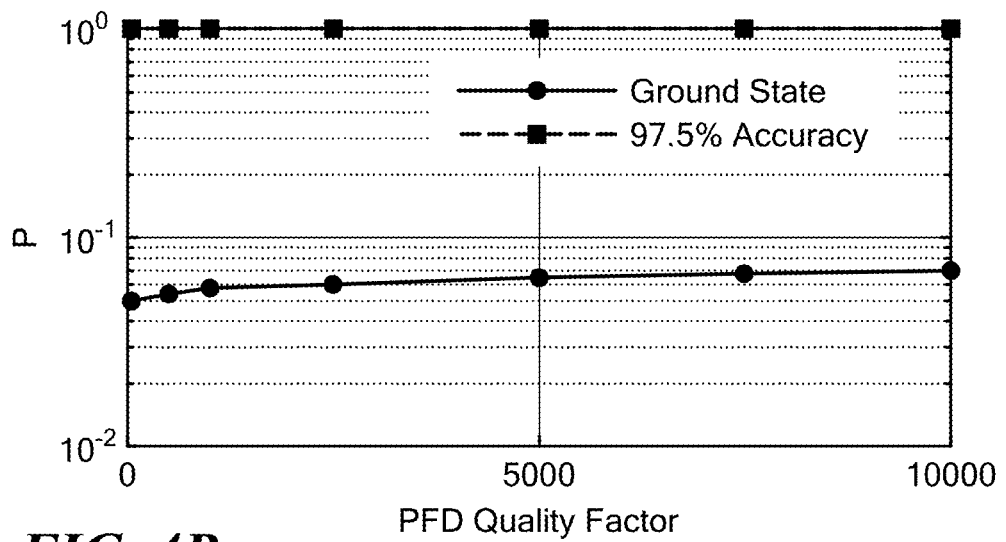
FIG. 4B illustrates numerically computed trends vs. Q of b) $P_{GS}$ and $P_{97.5\%}$.

Subsequently, a second study was conducted driven by the growing accessibility of high-Q chip-scale resonator technologies that can be manufactured using the same semiconductor processes employed for solid-state varactors and diodes. In particular, it was reasonable to question whether incorporating these resonators in place of the LC resonators currently used to construct PFDs could enhance the performance of PFD IMs. Therefore, the performance of PFD IMs vs. Q was analyzed. Initially, as shown in FIG. 4A, the trend of $PW_{spin}$ vs. Q was calculated through a circuit simulator.

PFDs as Parametrons

Figure 5:
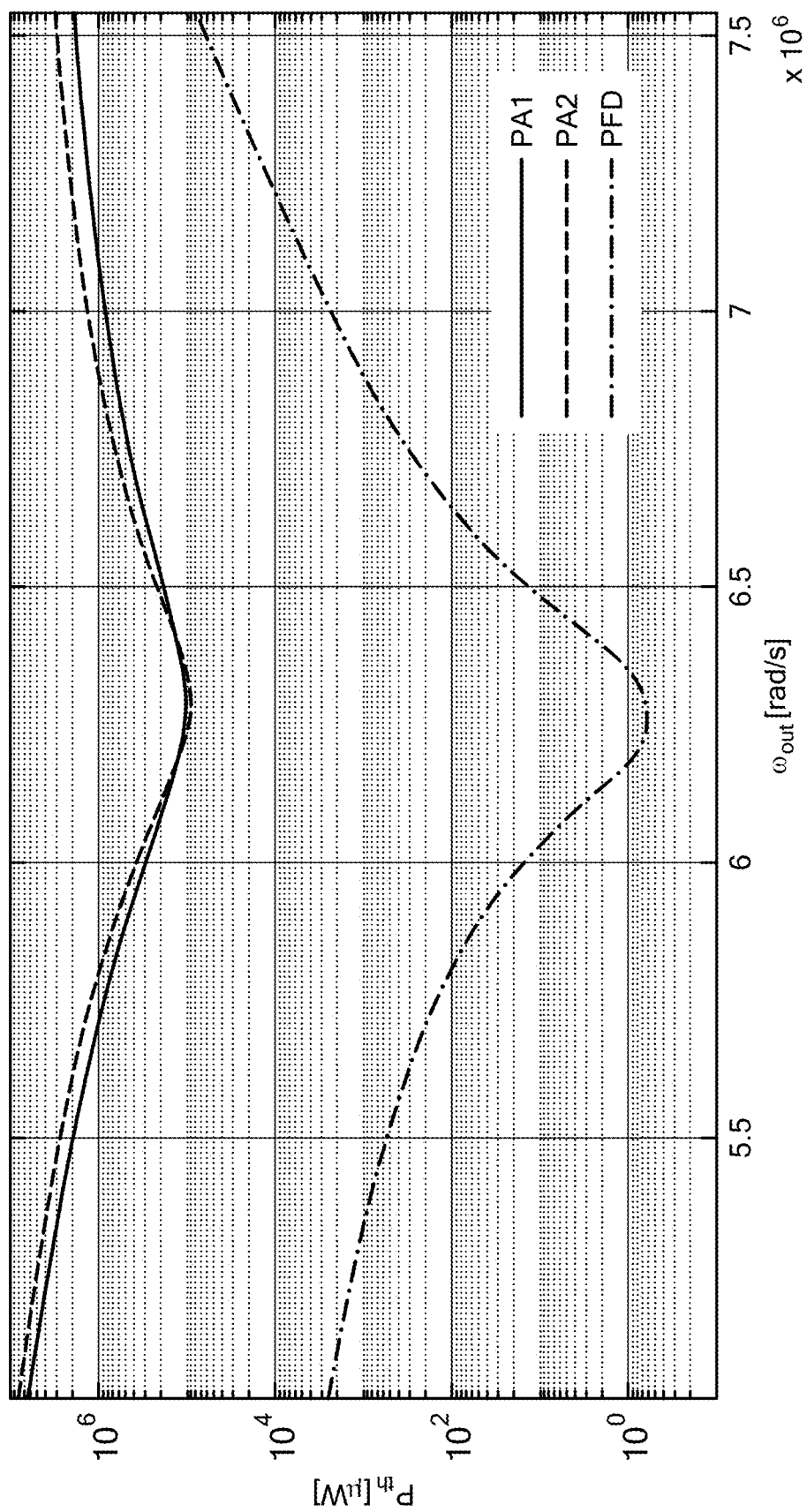
FIG. 5 illustrates simulated trends of the optimum power threshold vs. input frequency for the reported PFD design and for two parametron designs described in the prior art.

The utilization of parametrons was proposed several decades ago as an approach for analog computing owing to their inherent phase bistability. Yet, over the last two decades circuit designers working on electronic IMs have never really considered the possibility of using parametrons to build compact electronic-based IMs able to solve large-scale COPs. This is motivated by the fact that all prior parametron designs reported to date required a significant power to trigger their subharmonic oscillation, even approaching the Watts range in some cases. Also, designing parametrons in circuit simulations could not be easily done in the available circuit simulators due to constraints already discussed above. Despite the fact that PFDs have recently gathered significant interest for signal processing, frequency generation and sensing, they can operate as ultra-low power parametrons in the framework of analog computing. In fact, PFDs can trigger parametric oscillations at exceptionally low power levels by relying on four different resonances rather than on only one, as occurs instead in prior parametron designs. This allows reconstruction of the dynamics of an MR while ensuring, at the same time, the highest possible efficiency in modulating the MR's resonance frequency. Specifically, relying on different resonant conditions permits maximization of the voltage across the nonlinear capacitor at the pump frequency for any applied input power. This allows PFD IMs to surpass, by orders of magnitude, the power that any other parametron reported to date has been able to demonstrate. In this regard, existing parametrons have $P_{th}$-values fundamentally limited by the number of resonances leveraged to reinforce the parametric oscillation conditions. For instance, existing, non-PFD parametron designs, when using inductors having a same quality factor as those of the assembled PFD IMs and using a same nonlinear capacitor device as the assembled PFD IMs, exhibit a minimum power threshold five orders of magnitude higher than what is achieved by the PFDs described herein. This has been confirmed by circuit simulations, shown in FIG. 5. Note that the threshold power value reported in FIG. 5 for PA2 matches closely what was measured experimentally. In particular, PA2 requires a pump voltage of about 2.3 V to activate subharmonic oscillation, which corresponds to more than 100 mW when using a conventional 50 ohm signal generator.

Coupled PFDs as Coupled Parametrons

In order to understand what drives the activation of out-of-phase or in-phase signals in a network of MRs, it is necessary to recall the key dynamical feature governing the activation of parametric oscillations in a circuit containing a nonlinear capacitor. Subharmonic oscillations are triggered in such a circuit when the modulation of the nonlinear capacitor's reactance generates enough parametric gain to compensate for the losses in the circuit, which includes the MR's intrinsic losses ($R_S$) as well as the losses generated by the equivalent electrical resistance connected to it. By extending this concept to the illustrative system of two resistively coupled MRs (see FIG. 6A), it becomes evident that the two possible non-trivial solutions corresponding to in-phase and out-of-phase output signals are distinguished by different power thresholds.

Figure 6A:
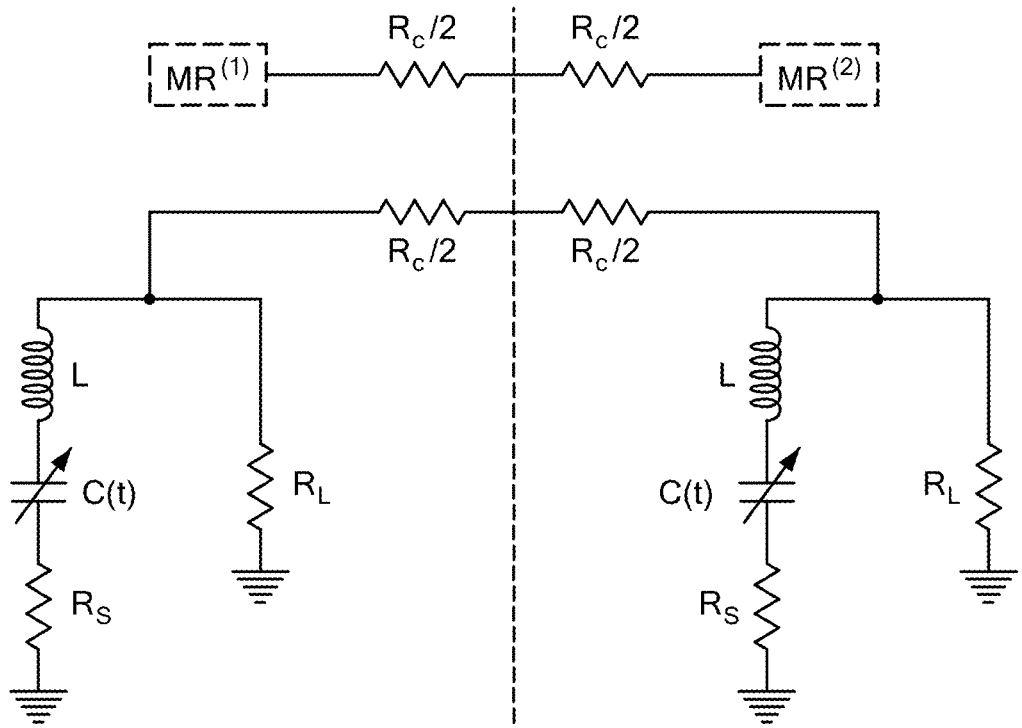
FIG. 6A illustrates a system-level and circuit-level schematic of two resistively coupled MRs.

In this context, if the two MRs in FIG. 6A were to settle into a state where their output signals are in-phase, no current would flow through the coupling resistor ($R_C$). As a result, the total losses that each MR would have to compensate for activating its subharmonic oscillation would be determined by the sum of $R_S$ and $R_L$. Differently, if the two MRs in FIG. 6A were to settle to a state corresponding to out-of-phase output signals, there would be current flowing into $R_C$. In other words, an out-of-phase coupling between the two MRs would result in each MR being connected to an equivalent resistance equal to the parallel combination of $R_L$ and $R_C/2$, which is lower than either resistor. These simple considerations suggest that the dissipative coupling for the circuit in FIG. 6A leads to a lower power threshold for activating out-of-phase subharmonic oscillations than in-phase MRs' output signals. As a result, when the pump power is activated and increased, the system of two MRs will reach the power threshold for the activation of out-of-phase parametric oscillations first. In other words, the resistively coupled MRs in FIG. 6A will always exhibit out-of-phase output signals when considering realistic $R_L$ and $R_C$ values.

Figure 6B:
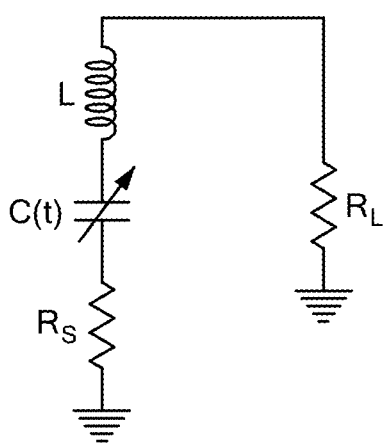
FIGS. 6B-6C illustrate equivalent "ferromagnetic" and "anti-ferromagnetic" circuits for the system of two resistively coupled MRs of FIG. 6A.
Figure 6C:
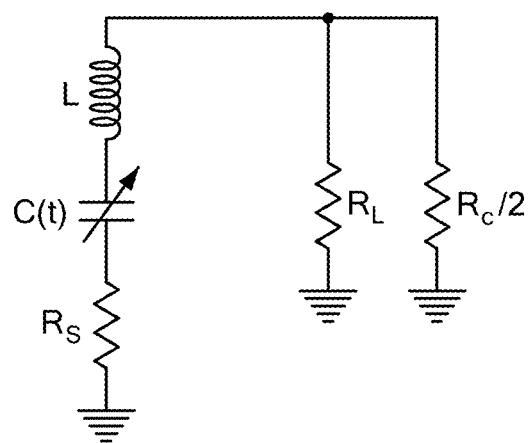
Figure 7A:
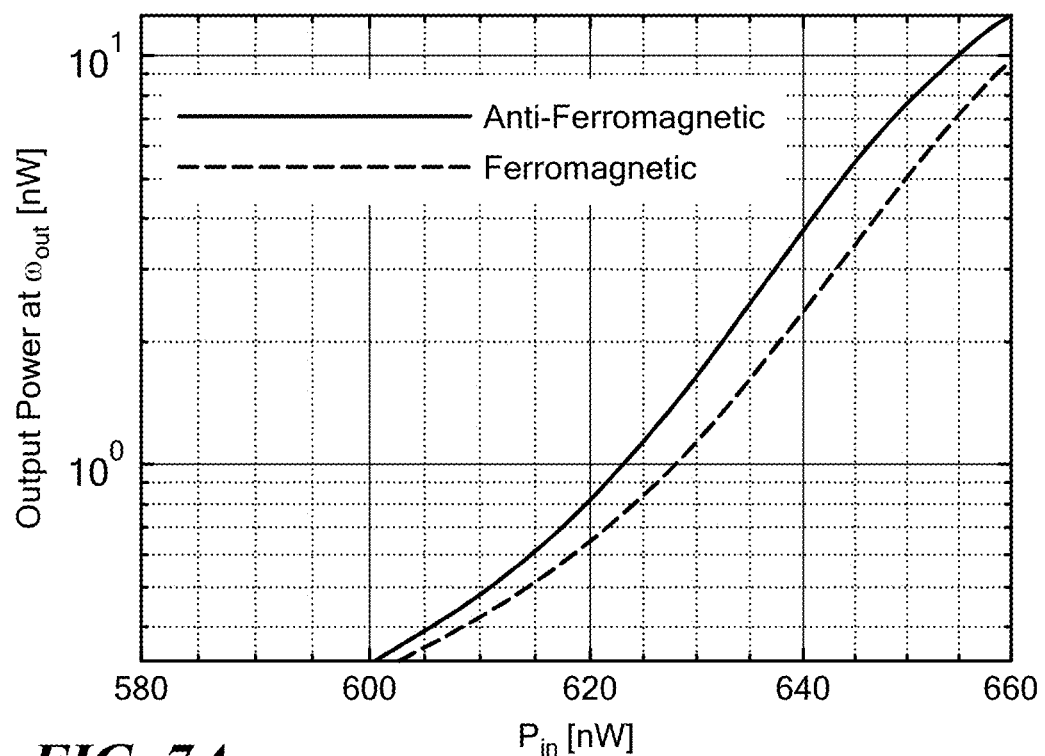
FIG. 7A illustrates numerical simulations of the power dissipated by RL at $\omega_{out}$ for both the ferromagnetic and the anti-ferromagnetic circuits shown in FIGS. 6B-6C. As shown, the anti-ferromagnetic solution exhibits a lower $P_{th}$ than the ferromagnetic circuit.
Figure 7B:
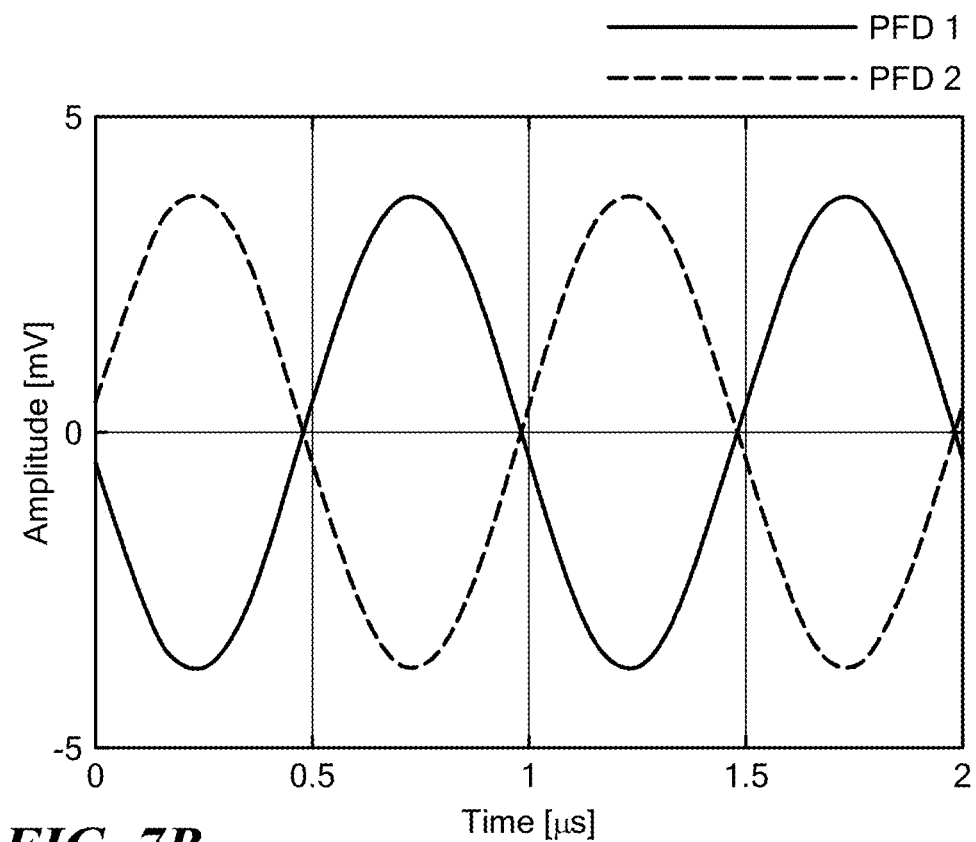
FIG. 7B illustrates simulated output voltage waveforms across RL for each of the two MRs coupled by RC of in the circuit shown in FIG. 6A.

This conclusion was drawn based on observations of the circuit shown in FIG. 6A but can be also formalized and validated by using a circuit simulation approach. In particular, the two coupled MRs in FIG. 6A can be analyzed by studying the response of two separate circuits (labeled as the "ferromagnetic" and "anti-ferromagnetic" circuits in FIGS. 6B and 6C) including only one MR and different electrical terminations (RL for the ferromagnetic circuit and the parallel of RL and $R_C/2$ for the anti-ferromagnetic circuit). The power threshold for each circuit can be retrieved by using numerical methods as shown in FIG. 7A, proving that the anti-ferromagnetic circuit has a lower power threshold than the ferromagnetic circuit. This has also been confirmed for the numerical case analyzed in FIG. 7B by running a circuit simulation of the full circuit formed by two MRs as shown in FIG. 6A. The simulation results shown in FIG. 7B confirm that the two MRs show indeed out-of-phase output signals.

A ferromagnetic coupling between two PFDs can also be implemented (e.g., if needed to reconstruct an in-phase relationship between the PFDs' output signals). This can be done by using coupling capacitors. In fact, relying on capacitive components permits detuning of the resonance frequency of the PFDs' output mesh when considering the anti-ferromagnetic circuit. This detuning causes an increase of the power threshold of the anti-ferromagnetic circuit, while not affecting the power threshold of the ferromagnetic circuit. Having explained the phase-relationship between the output signals of two MRs, it is easier to understand the principle of computation for PFD IMs. In this regard, PFD IMs operate under the principle that the lowest energy solution identifying the ground-state corresponds to the combination of spin-orientations that requires the lowest power to be activated.

Figure 4C:
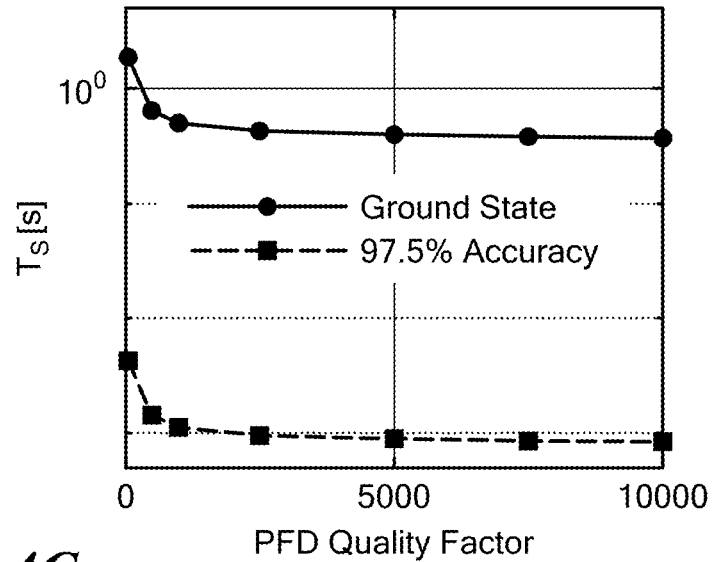
FIG. 4C illustrates numerically computed trends vs. Q of $T_S$ when considering A=97.5% or A=100%.
Figure 4D:
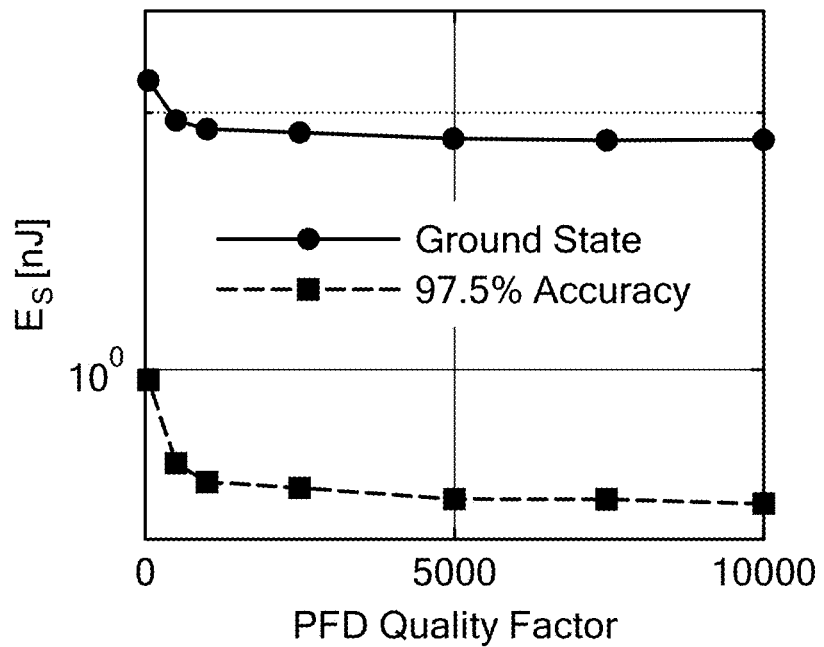
FIG. 4D illustrates numerically computed trends vs. Q of $E_S$ when considering A=97.5% or A=100%.
Figure 4E:
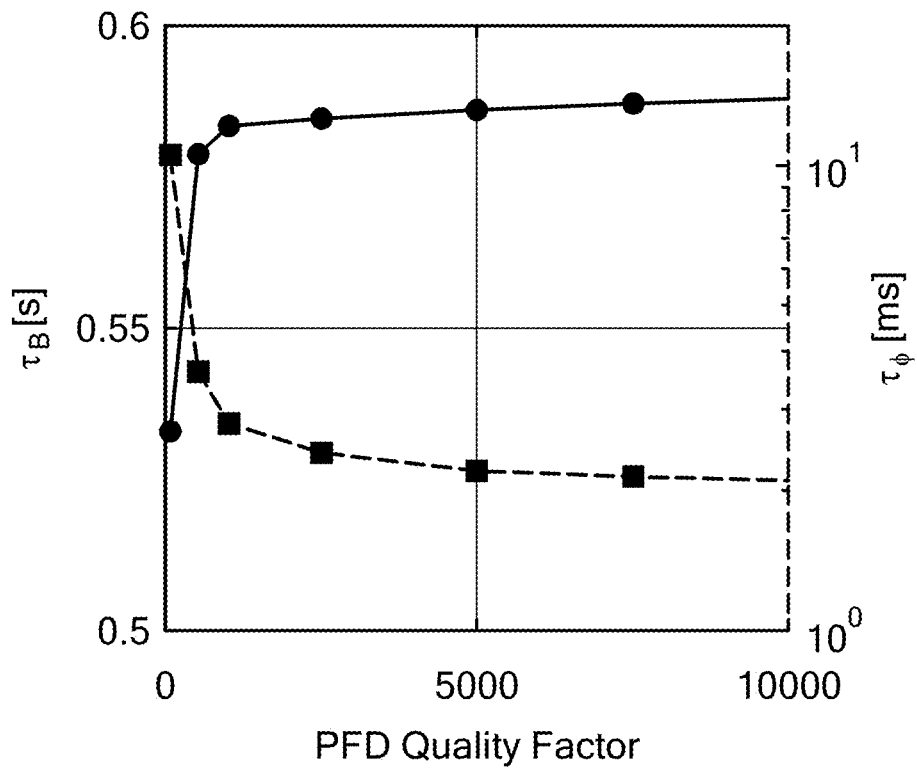
FIG. 4E illustrates numerically computed trends vs. Q of $\tau_B$ and $\tau_\phi$ when considering A=97.5% or A=100%.

It was found that relying on resonators with Qs higher than 1000 permits a reduction of $PW_{spin}$ down to 60 nW, which is three orders of magnitude lower than the power required by each oscillator in a state-of-the-art SHIL IMs. It is worth emphasizing that the saturation of $PW_{spin}$ for Q values higher than 1000 originates from the fact that $R_L$ and $R_d$ do not scale down with Q. Also analyzed were P (FIG. 413), $T_S$ (FIG. 4C) and $E_S$ (FIG. 4D) vs. Q for a 400 node PFD IM solving the same Max-Cut problem that was considered in FIGS. 3A-3C when assuming minimum tolerated accuracy levels of 100% and 97.5%, as above. It was found that relying on higher Q resonators does not significantly change the values of $P_{GS}$ and $P_{97.5\%}$ with respect to the values found for a Q equal to 50 in FIGS. 3A-3C. However, $T_S$ reduces when assuming higher Q values, despite the fact that high-Q resonators inherently exhibit a longer relaxation time. This is due to the fact that $\tau_\phi$ shortens when considering high Q values, even though a longer relaxation time (TB) is needed for the MRs to reach their steady-state amplitude (FIG. 4E). Consequently, PFD IMs that rely on higher Q resonators inherently exhibit a lower $E_S$ than their lower Q counterparts. As such, they are better suited for addressing COPs with a large number of variables. Finally, the impact of $\tau_{ann}$ on the computing performance of PFD IMs has also been analyzed for different N and Q values. In this regard, it was unexpectedly found that using a slower annealing rate when tackling Möbius ladder problems leads to lower $T_S$ and $E_S$ values, despite the increase of $\tau_\phi$ and independently of the MRs' Q value. It was also verified, as described below, that this improved performance can be attributed to a significant reduction in amplitude heterogeneity for longer annealing rates. This advantageous impact of the annealing schedule on all performance metrics of PFD IMs underscores a significant divergence from the SHIL IMs. In fact, unlike PFD IMs, using an annealing schedule may enhance the probability-of-success in SHIL IMs but also concurrently yields to degraded $T_S$ and $E_S$ values.

Impact of the Annealing Schedule on the Performance of PFD IMs

The ability of IMs to achieve an accurate solution for a given combinatorial optimization problem decays rapidly as the number of unknowns in the problem (N) increases. This poses significant challenges in achieving IMs that can accurately solve realistic, large-scale problems where N is much higher than $10^3$. The use of an annealing schedule has been employed to address this limitation in OIMs. By incorporating an annealing schedule, in fact, the effectiveness of OIMs in preventing convergence to local minima and successfully identifying an accurate solution can be greatly enhanced, thereby leading to higher probabilities-of-success. However, in the context of existing SHIL IMs, relying on an annealing schedule also leads to longer times-to-solution, creating a trade-off between solution accuracy and energy-to-solution that are difficult to overcome. Accordingly, the impact of using an annealing schedule on the performance of PFD IMs was examined. Toward that end, during the analytical evaluation of the computing performance of PFD IMs, an exponential-based annealing schedule, described in Eq. (25), was used. The purpose was to gradually increase the value of p from $0.99p_{th}$ (e.g., right below threshold) to $1.005p_{th}$ (e.g., right above threshold), with a rate set by $\tau_{ann}$.

$$p(\tau)=p_{th}[0.99+0.015(1-e^{-t/\tau_{ann}})] \quad (25)$$

Figure 8C:
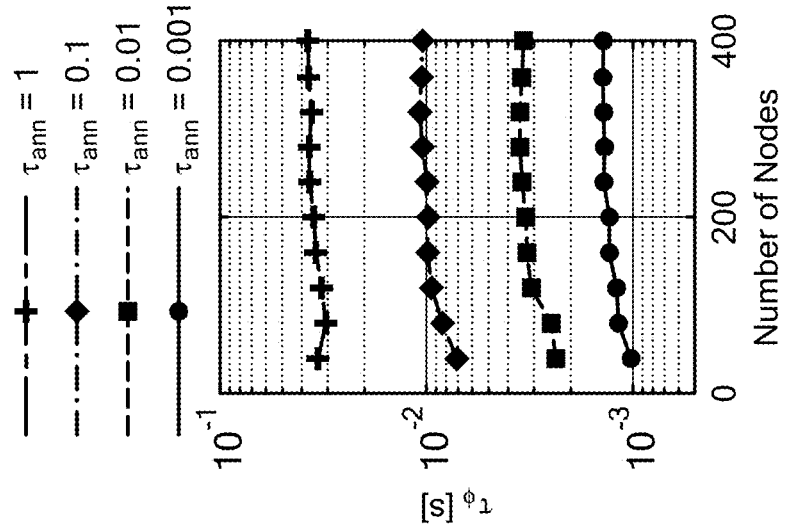
FIG. 8C illustrates numerically computed trends vs. N of $\tau_\phi$ when considering Q=50 and when assuming different values (in seconds) for $\tau_{ann}$.
Figure 8B:
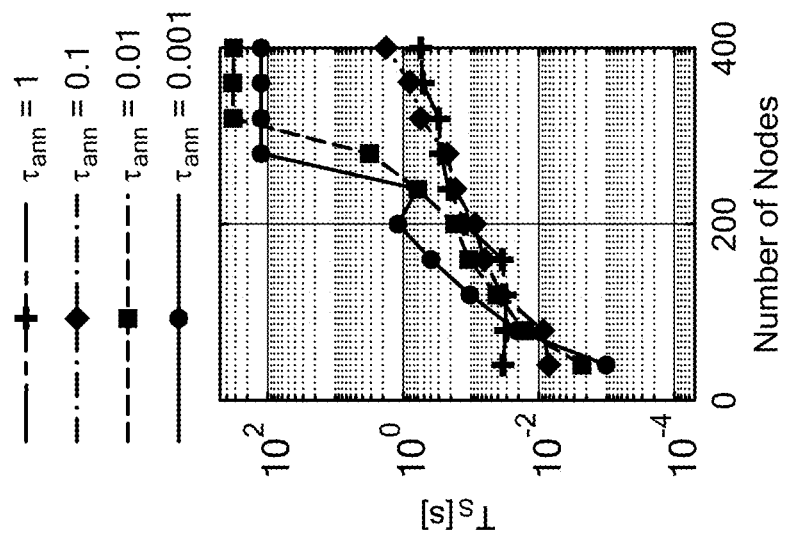
FIG. 8B illustrates numerically computed trends vs. N of $T_S$ when considering Q=50 and when assuming different values (in seconds) for $\tau_{ann}$.
Figure 8A:
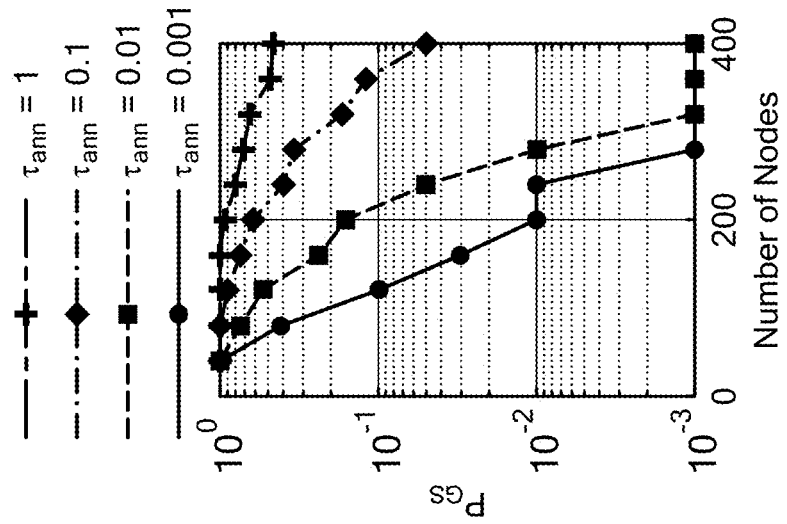
FIG. 8A illustrates numerically computed trends vs. N of $P_{GS}$ when considering Q=50 and when assuming different values (in seconds) for $\tau_{ann}$.
Figures 9A, 9B, 9C:
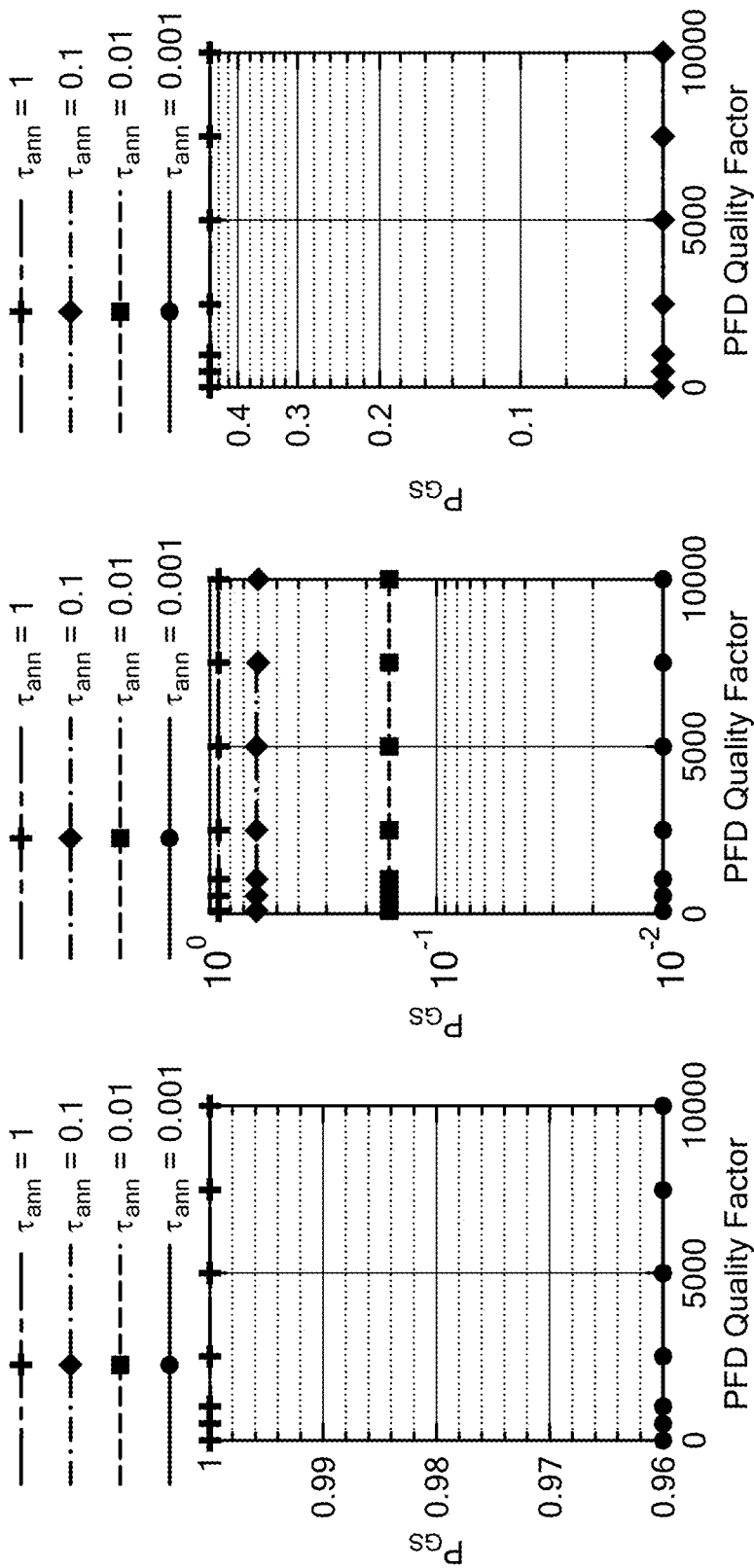
FIG. 9A illustrates numerically computed trends vs. Q of $P_{GS}$ when N=40 for different values of $\tau_{ann}$.
FIG. 9B illustrates numerically computed trends vs. Q of $P_{GS}$ when N=200 for different values of $\tau_{ann}$.
FIG. 9C illustrates numerically computed trends vs. Q of $P_{GS}$ when N=400 for different values of $\tau_{ann}$.
Figures 9D, 9E, 9F:
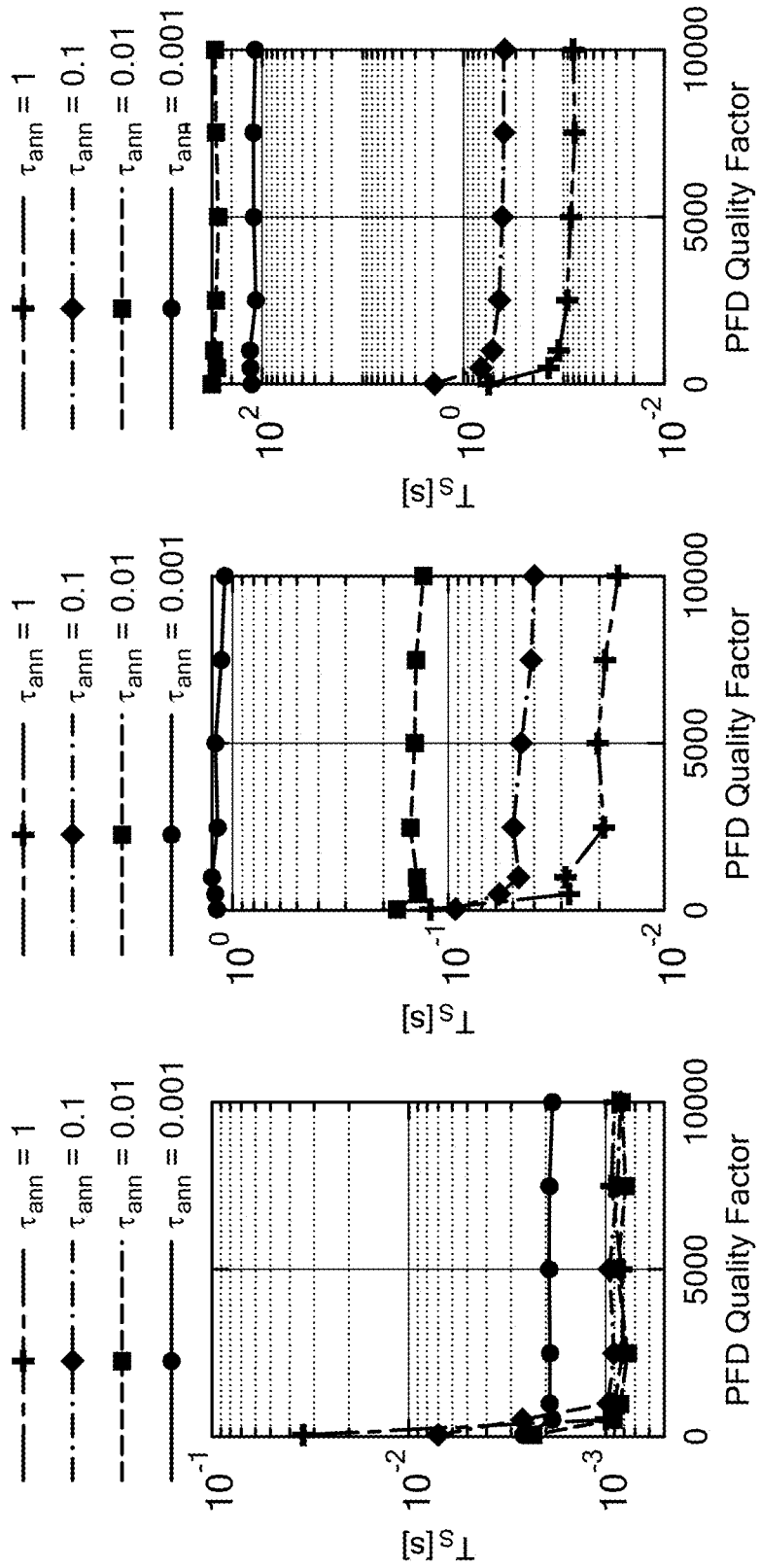
FIG. 9D illustrates numerically computed trends vs. Q of $T_S$ when N=40 for different values of $\tau_{ann}$.
FIG. 9E illustrates numerically computed trends vs. Q of $T_S$ when N=200 for different values of $\tau_{ann}$.
FIG. 9F illustrates numerically computed trends vs. Q of $T_S$ when N=400 for different values of $\tau_{ann}$.

As shown in FIGS. 8A-8C, the performance of PFD IMs was assessed for different $\tau_{ann}$ values and for N varying from 40 to 400. The findings unexpectedly and advantageously revealed that, when employing longer $\tau_{ann}$ values, PFD IMs show not only higher $P_{GS}$ values but also shorter $T_S$ values and, consequently, lower $E_S$ values. This is motivated by the fact that using the selected annealing schedule causes an increase of $\tau_\phi$ that has a lower impact on $T_S$ than the concurrent increase of $P_{GS}$ especially for high N values. This is fundamentally different from what happens in SHIL IMs, which exhibit a linear dependence between $T_S$ and their employed annealing rate. The advantage of employing the annealing schedule to enhance the overall performance of PFD IMs was also investigated for different Q values, ranging from 50 to 10000, and for various N values, ranging from 40 to 400 as shown in FIGS. 9A-9I. In this second study, it was found that varying Q does not alter significantly the relationship between $\tau_{ann}$ and $P_{GS}$. Similarly, using resonators with Q higher than 1000 in the PFDs' design leads to minor reductions of $T_S$ and $E_S$ that become significant only when using longer $\tau_{ann}$ values. Meanwhile, as discussed above, using higher-Q resonators in the PFDs' design enables lower $Pw_{spin}$ which is crucial to ensure an accurate resolution of large-scale combinatorial optimization problems while still consuming a reasonably low amount of power.

Figure 10:
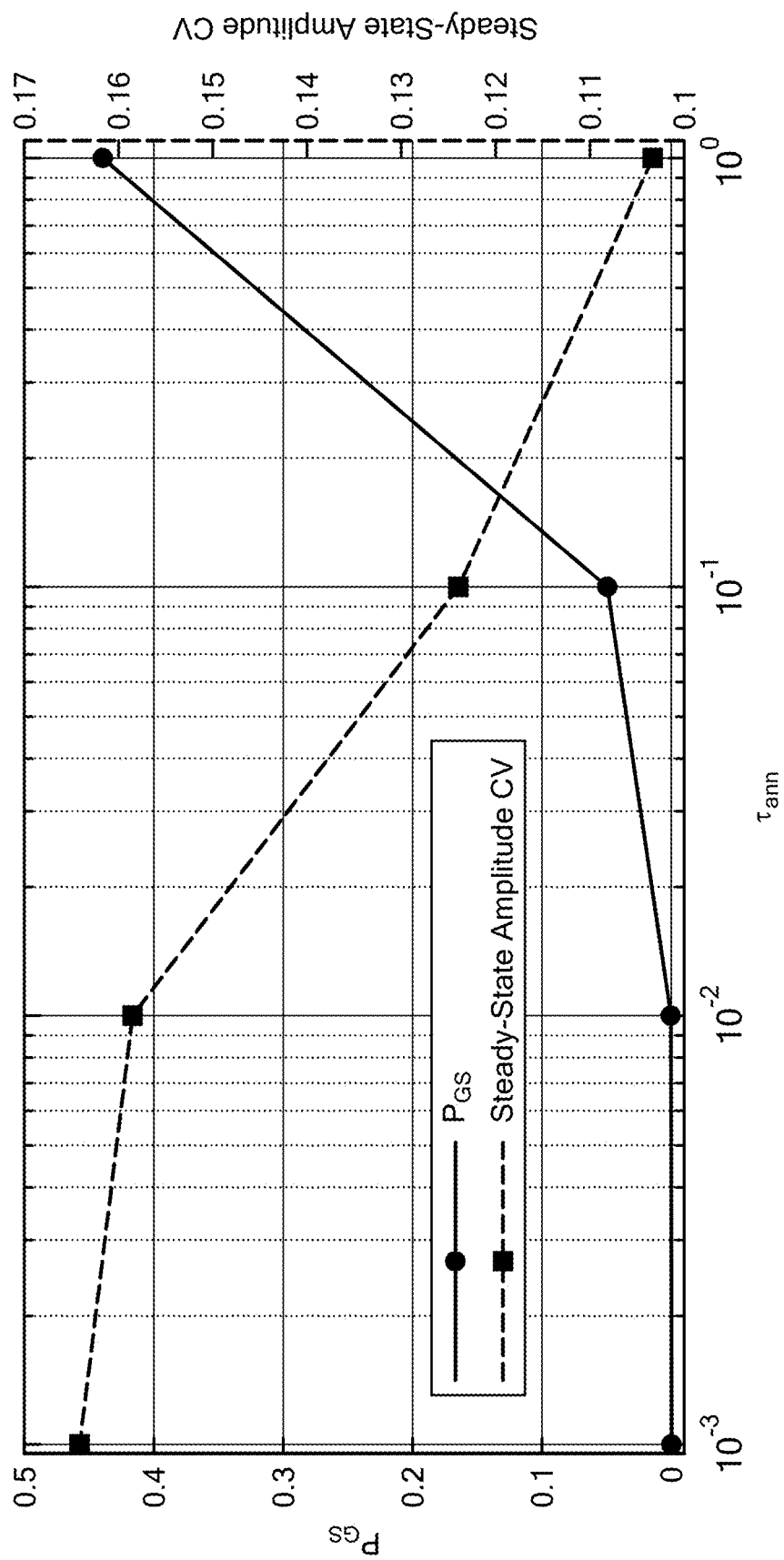
FIG. 10 illustrates numerically computed trends vs. $\tau_{ann}$ of $P_{GS}$ and CV for a 400-node Möbius ladder problem.

To elucidate on the origin of the computing performance improvement due to the adoption of an annealing schedule, the impact of $\tau_{ann}$ on the convergence dynamics of the system was also investigated. In this regard, asp is gradually increased through annealing from a value below $P_{th}$ to one above $p_{th}$, it was found that the system experiences a reduction in amplitude heterogeneity. It is well established that in oscillator-based IMs, cases exhibiting substantial amplitude heterogeneity are more prone to converging towards energy minima levels that no longer correspond to the ground state of the initial Ising Hamiltonian mapping the problem to be solved. Thus, differences in steady-state amplitudes among the MRs alter the nature of the problem that is solved by effectively changing the coupling strengths among the MRs with respect to what is set by $G_c$ and by the problem graph. It is through the introduction of annealing that a system can be guided toward a more accurate solution of the problem by enforcing that the selected coupling weights between nodes remain nearly unchanged throughout the duration of the system's phase synchronization. To analytically verify this finding, a study was conducted where the average coefficient of variation (CV), representing the ratio of the standard deviation and the mean) of the steady-state amplitudes of all the oscillators used to solve an N=400 Möbius ladder problem was analyzed. For each set of 100 runs of this problem, different $\tau_{ann}$ values matching those used in FIGS. 9A-9I were considered. The extracted distributions of CV and $P_{GS}$ vs. $\tau_{ann}$ can be found in FIG. 10. As shown in FIG. 10, as the annealing gets slower (corresponding to an increase in the value of $\tau_{ann}$), CV reduces and the system becomes more likely to minimize the Ising Hamiltonian of the specified original problem.

Figure 11A:
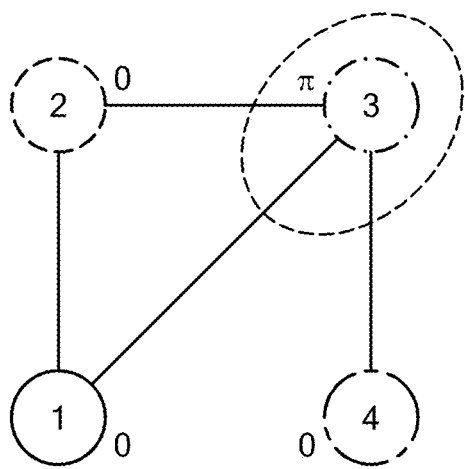
FIGS. 11A-11B illustrate graphs and PFD output voltage waveforms for two Max-Cut problems solved using the PFD IM of FIG. 1B.
Figure 11A:
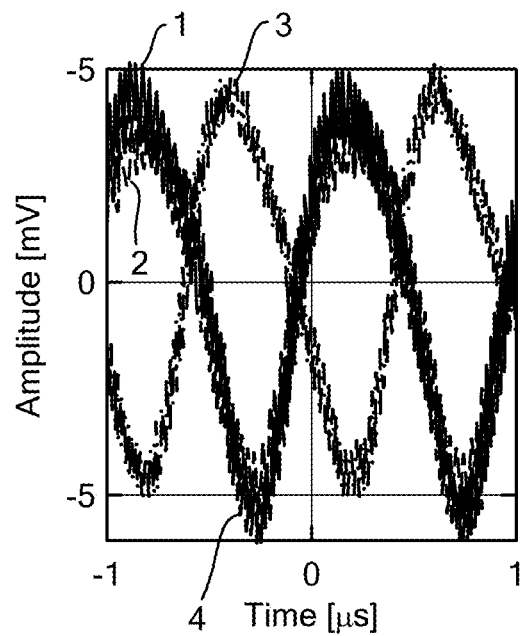
Figure 11B:
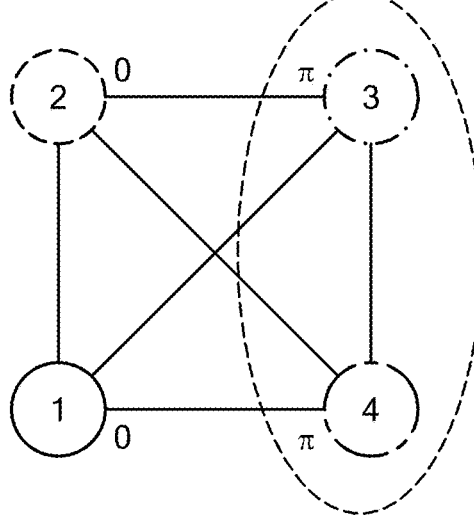
Figure 11B:
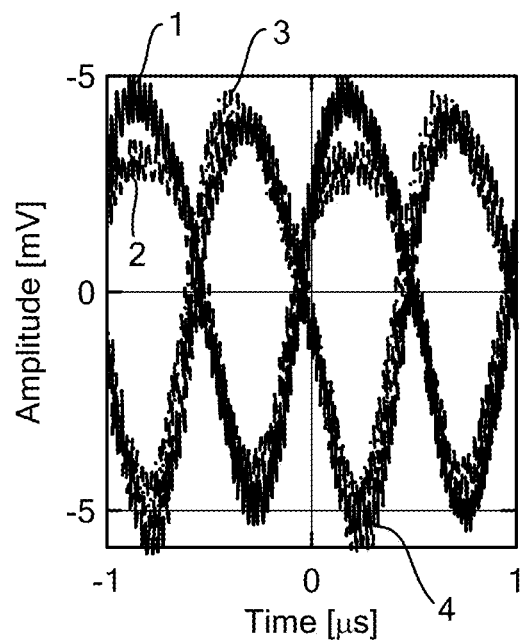

As a proof of concept, a first prototype of a PFD IM was built and employed to solve different unweighted Max-Cut problems. In particular, four identical PFDs, designed to work with a $\omega_{in}$ value of $4\pi*10^6$ rad/s, were assembled on a printed-circuit-board (PCB) by using off-the-shelf inductors and capacitors to create resonant tanks with a Q value of nearly 50. Identical 2kΩ coupling resistors, corresponding to 500 μS coupling conductances were used in the manner shown in FIG. 1B to couple the four PFDs according to the specific problem to be solved. By running an electrical characterization of the PFDs, a $PW_{spin}$ value of 600 nW was able to be demonstrated. To the inventors' knowledge, 600 nW is the lowest $PW_{spin}$ value ever recorded for OIMs by at least two orders of magnitude. It is worth emphasizing that all PFDs were designed to generate their subharmonic oscillation without requiring DC-voltages and thus without consuming any DC power for biasing the circuit, further reducing $PW_{spin}$. FIGS. 11A-11B show the graphs of two of the nine Max-Cut problems investigated and solved by the experimental PFD IM, together with the corresponding measured PFDs' output voltage. As shown, the computed phase distribution matches the expected correct solution for every problem evaluated. A description of the experimental setup used during the testing of the assembled PFD IM is provided in below, together with the graphs and output voltage waveforms for the other Max-Cut problems that were solved.

Experimental Setup

Figure 12:
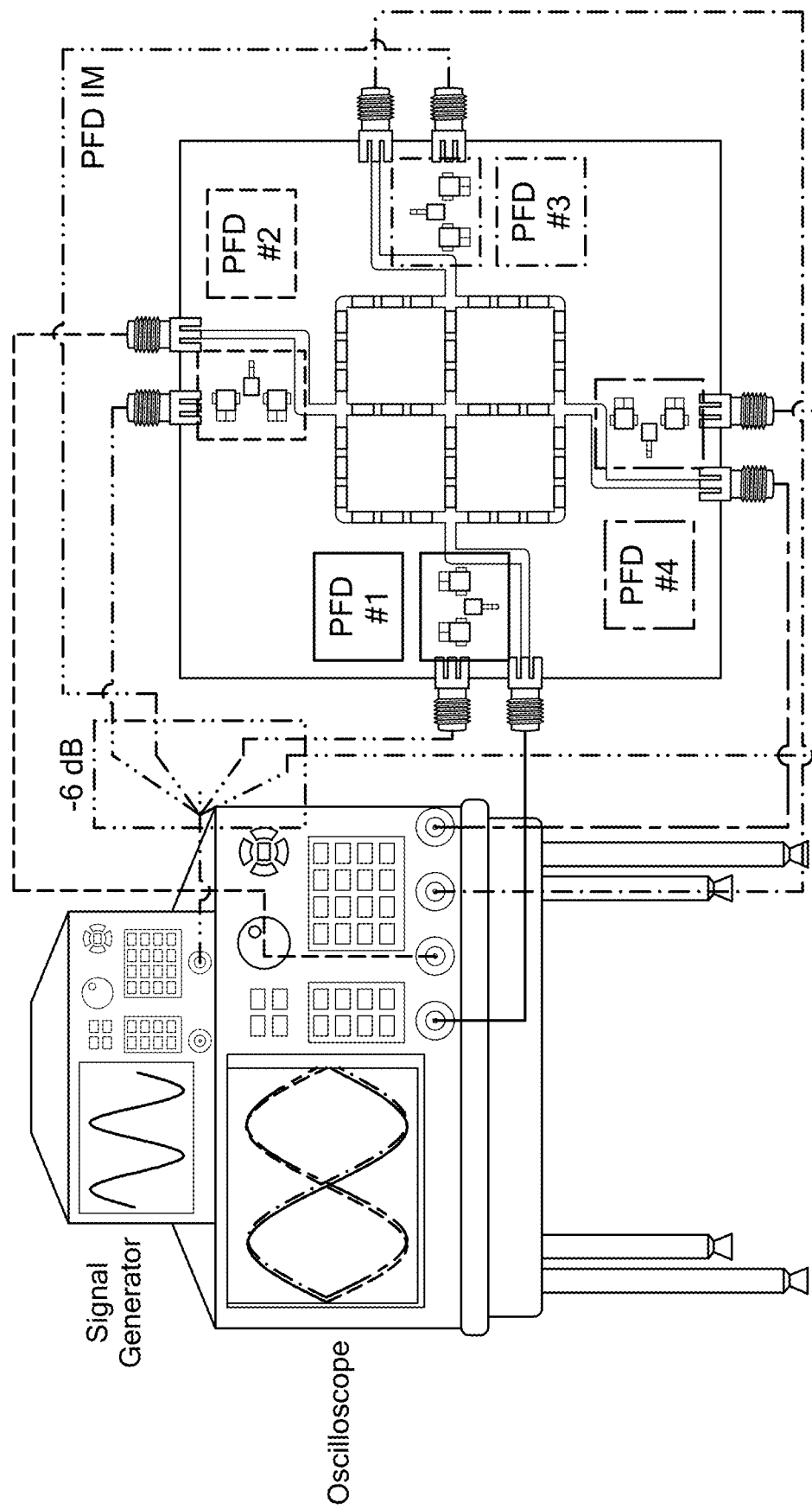
FIG. 12 illustrates an experimental setup used for measuring output waveforms of an assembled 4-node PFD IM. Each PFD is driven by the same power-divided input signal and the output voltage of each PFD is measured in time-domain by using an oscilloscope.
Figure 13I:
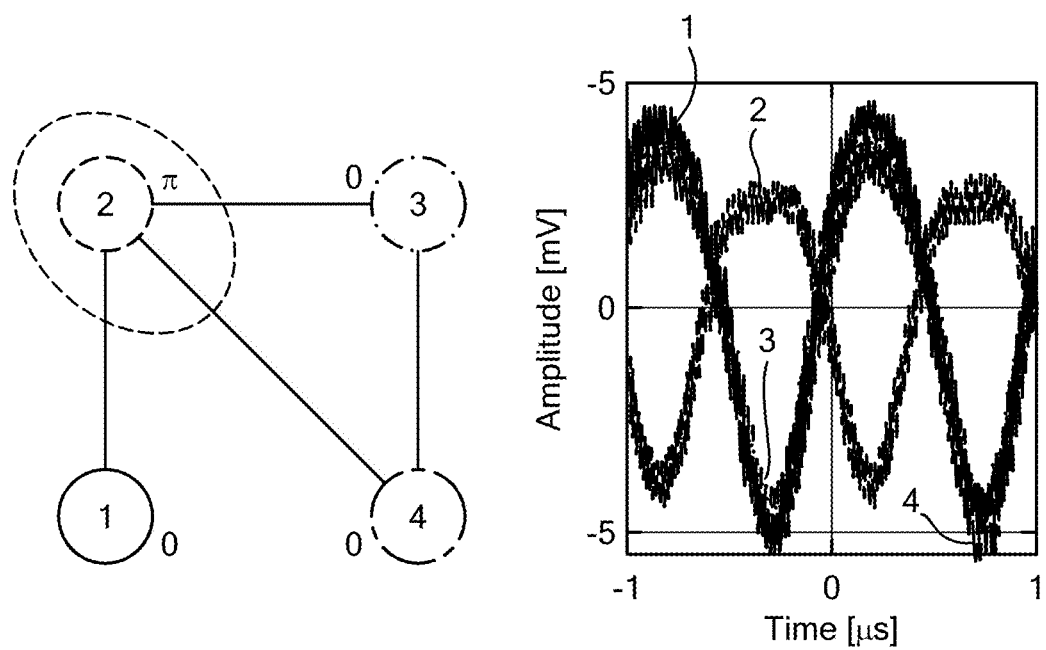
Figure 14A:
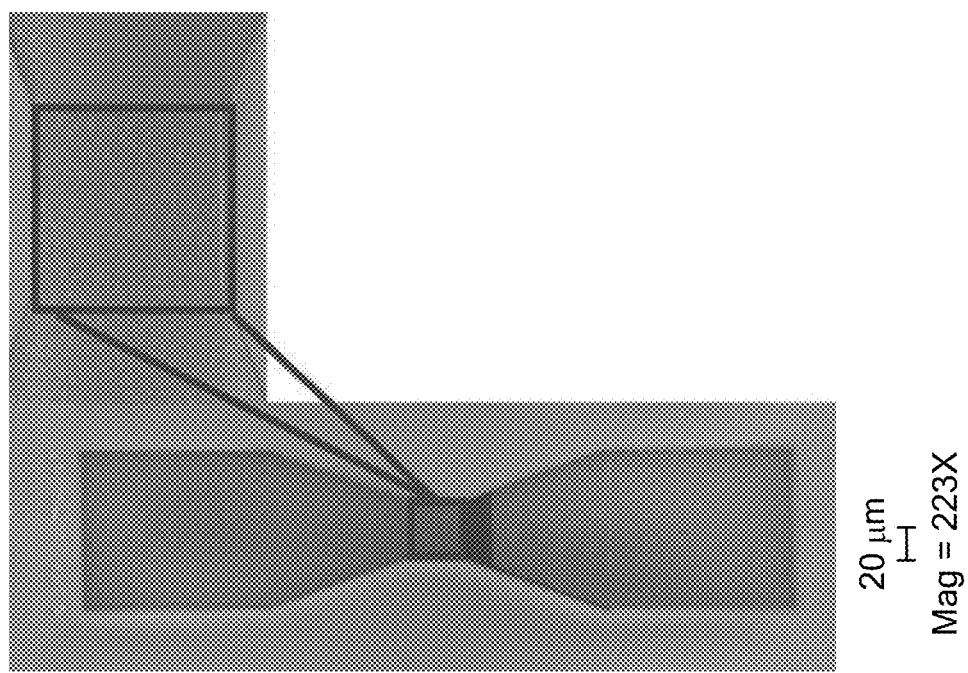
FIG. 14A illustrates as scanning electron microscope (SEM) image of a fabricated HZO varactor device and magnification on a parallel plate capacitance structure thereof in accordance with various embodiments.
Figure 14B:
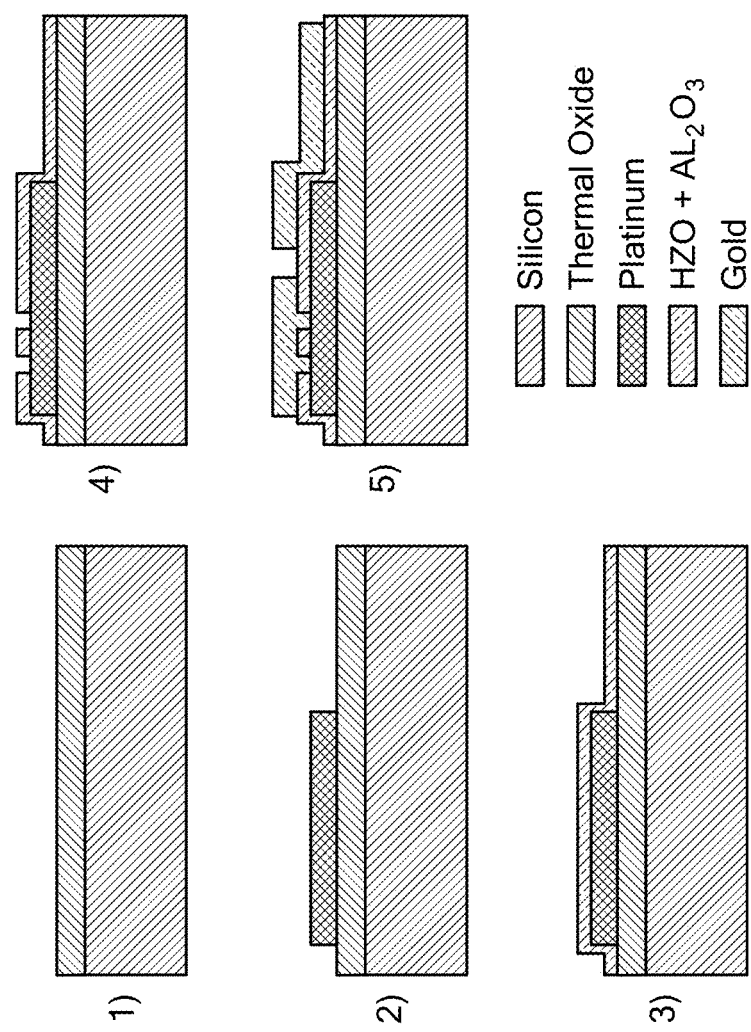
FIG. 14B illustrates a fabrication process used to build the HZO varactor of FIG. 14A. Initially (step 1) a silicon wafer with a 150 nm thermal oxide was provided as the substrate. The substrate was then (step 2) sputtered and patterned with a100 nm thick platinum electrode by lift-off. Next (step 3) a 20 nm thick HZO+3 nm thick $Al_2O_3$ layer was deposited using atomic layer deposition. Vias were created (step 4) using a dry plasma etch process. A 150 nm thick gold layer was deposited (step 5) using E-beam evaporation. After step 5, the deposition samples were annealed in a rapid thermal processor in an $N_2$ environment at 400° C. for 40 seconds.
Figure 15A:
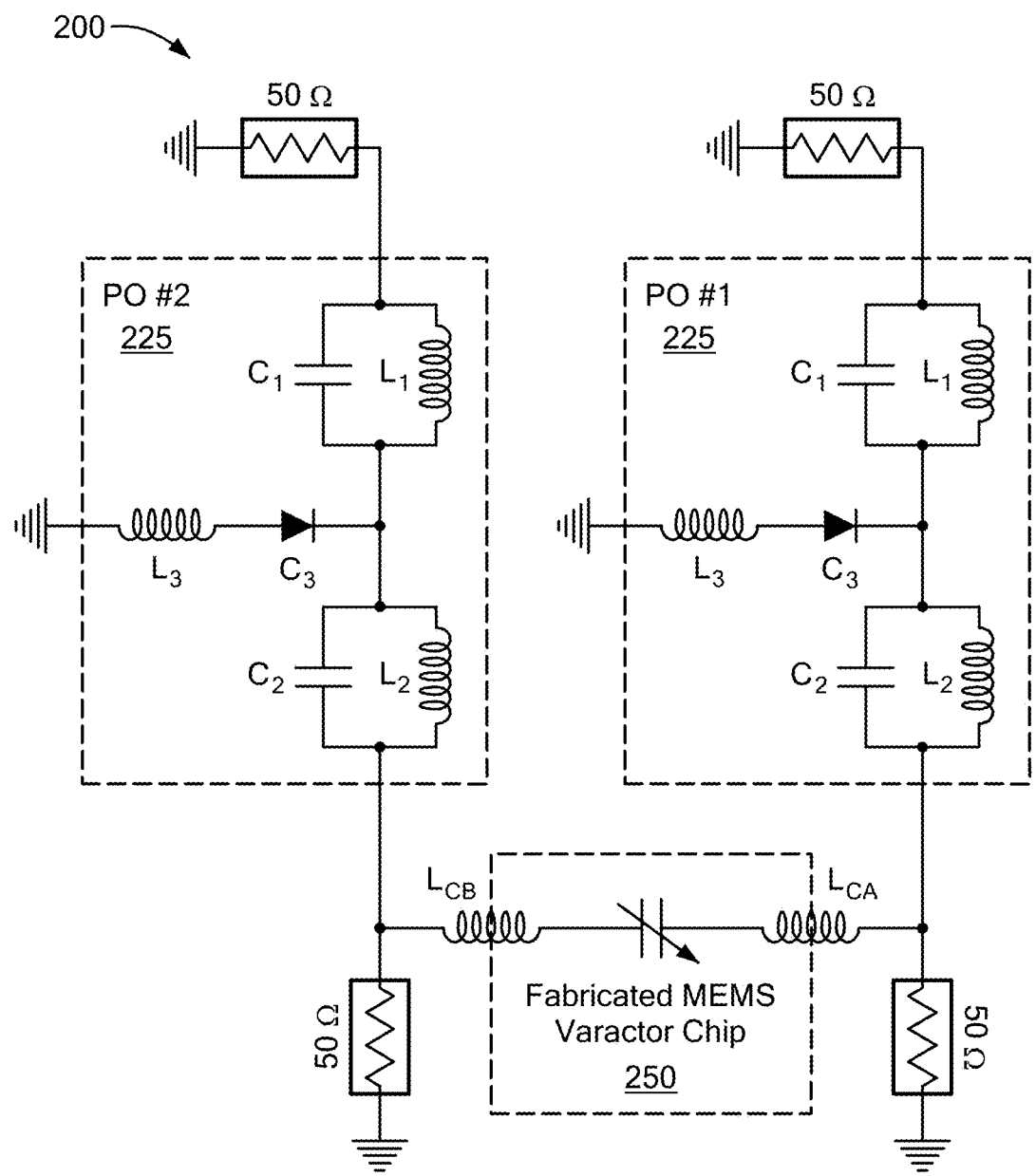
FIG. 15A: illustrates a schematic view of an Ising system using two coupled parametric oscillators (POs) and the HZO varactor of FIGS. 14A-14B in their coupling network.
Figure 15B:
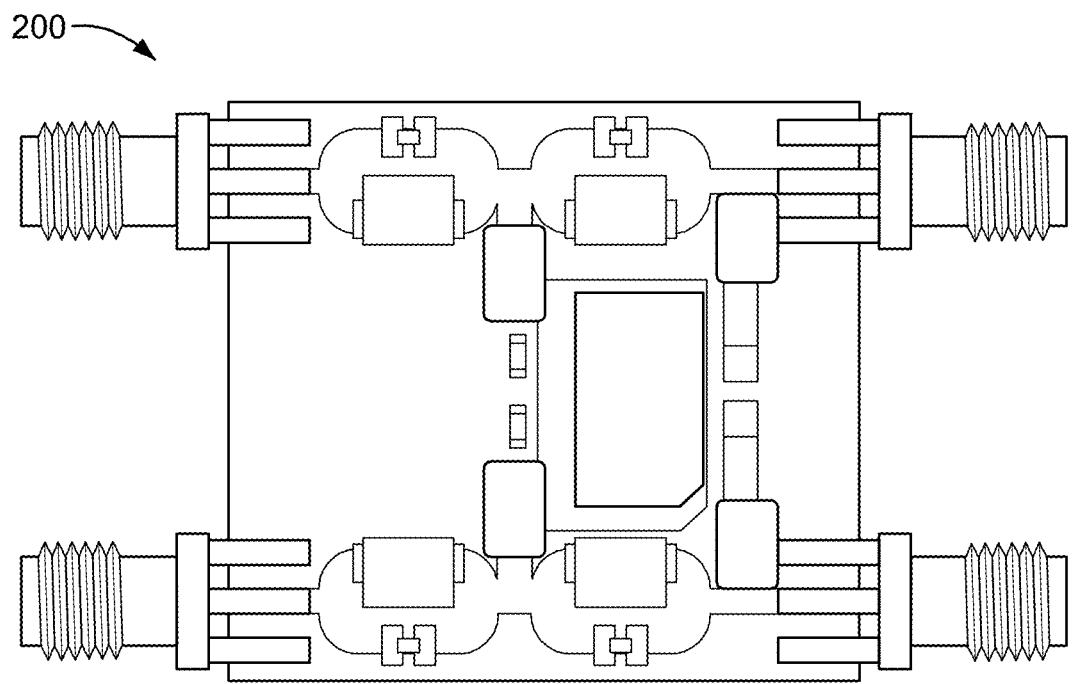
FIG. 15B illustrates a top-view photograph of the constructed PCB hosting the Ising system of FIG. 15A, showing the HZO device after wire-bonding.
Figure 15C:
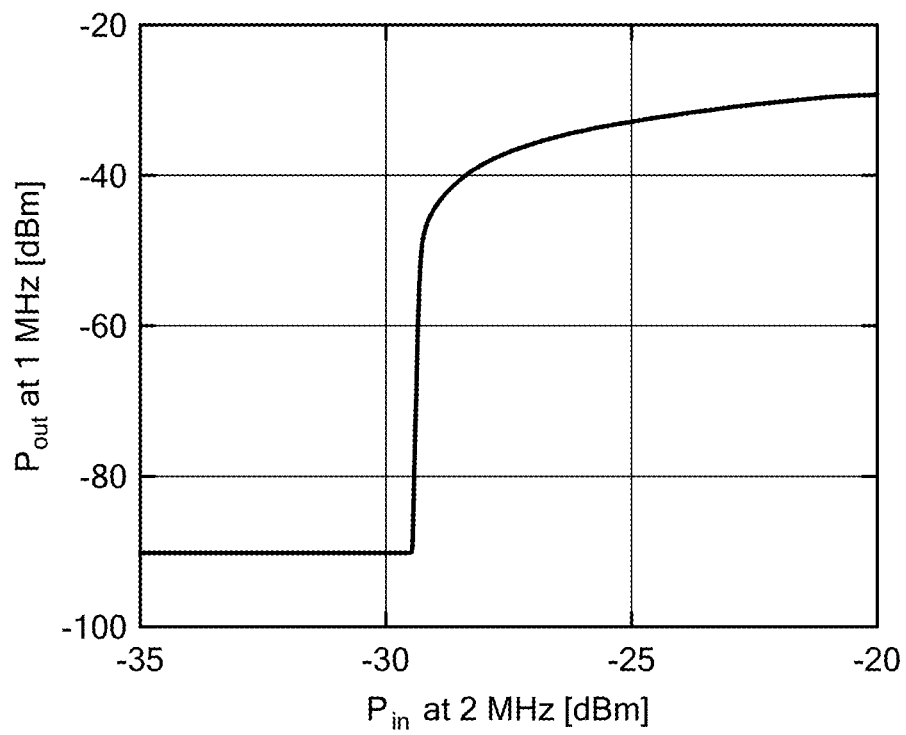
FIG. 15C illustrates a measured trend of the output power of the POs at 1 MHz vs. their input power at 2 MHz.

As shown in FIG. 12, an experimental PFD IM included four identical PFDs, together with the routing lines and the soldering pads required for programming the PFDs' coupling. The PFDs' output ports were coupled by 2 kW resistors, following the graph of the specific problem to be solved. In this regard, the absence of a resistor between two PFDs represented a disconnection between them in the problem graph. All the PFDs were driven by the same 2 MHz input signal, equally split. Because the problem-size used for validation of the PFD IM was reduced, no annealing step was implemented. As shown in FIG. 8A, executing an annealing step is only necessary for large N-values.

In order to validate the proper functioning of the PFD IM, the PFDs' output ports were connected to various ports of an oscilloscope (Model No. InfiniiVision DSOX6004A) and their time-domain output voltage was measured. In addition, PFD 1 was arbitrarily assigned as the reference PFD for the evaluation of the computed solution and, consequently, for the extraction of the computed maximum number of cuts as described herein. In this regard, an approach relying on determining the cross-correlation between any given PFD's output signal and the reference's output signal was employed to determine the phase-shift between each PFD's output signal and the output signal of PFD 1. This enabled determination of whether the solution computed by the PFD IM was correct. Moreover, for each problem solved during experimentation, the PFD IM was used to search for the solution five times and the system converged to the correct solution of the problem graph during each run. Finally, in order to switch between different problems, the set of coupling resistors connected to the circuit was manually changed.

FIGS. 13A-13I show all the investigated Max-Cut problem graphs and their solutions, along with the PFDs' measured output waveforms. The inventors note that the PFD IM retrieved the correct solution for all attempted problems and for all executed problem runs.

PFD IMs and their computing performance when tackling various Möbius ladder problems with up to 400 nodes have been described herein. The described findings suggest that incorporating high-Q resonators in the PFDs' design and using an annealing schedule advantageously decreases the $PW_{spin}$ down to the nanoWatt-range, shortens the time-to-solution to less than 0.6 s, boosts the probability-of-success up to 46%, and achieves a 10 μJ energy-to-solution for a 400-node Möbius ladder problem. Also described herein is a designed, built, and tested prototype PFD IM that integrates four PFDs to solve several different Max-Cut problems. This prototype achieves a power-per-spin of 600 nW by relying on off-the-shelf LC resonators with a Q of 50. This demonstrated power-per-spin is the lowest ever reported for OIMs.

Although illustrated and described herein in the context of Möbius ladder problems, PFD IMs are applicable more broadly for any NP instances, including those with densely connected graphs.

Two-Spin Configuration Using HZO Varactors

Also described herein is an Ising system 200 formed by two artificial spins and relying on a ferroelectric MEMS device 250 to permanently configure the spins' interaction to ferromagnetic or anti-ferromagnetic. These spins, including two parametric oscillators (POs) 225 built from off-the-shelf components, are driven by the same ~2 MHz ("pump") signal and are coupled through a series LC-network with resonance frequency fc formed by two inductors and a microfabricated hafnium zirconium oxide (HZO) MEMS varactor 250. The present technology leverages the nonvolatile ferroelectric memory characteristic of the HZO varactor 250 so as to allow a shift of fc to a lower or to a higher value than ~1 MHz based on HZO polarization state, triggering a nonvolatile ferromagnetic or anti-ferromagnetic interaction without consuming power for the spin-coupling during system operation. These features, together with the exceptionally low power threshold of the POs 225, allows the present Ising system 200 to consume the lowest power-per-spin (~600 nW) reported to date (see Table 1).

TABLE 1

Comparison between the PO Ising system and previously available Ising systems.

| Type of Oscillator | Operational Frequency | Power per Spin |
|---|---|---|
| LC | 1 MHz | 20.8 mW |
| LC | 50 kHz | / |
| Ring | 1 GHz | 23 µW |
| Ring | 118 MHz | 41 µW |
| PO | 2 MHz | 600 nW |

The present inventors have developed a system in which CMOS-compatible Ising-spins made of POs are driven by the same ~2 MHz pump signal and have been engineered to consume only nW-power. The system further provides a coupling network which is unbiased during the spin-operation and is composed of two inductors and a ferroelectric HZO capacitor. The inventors have demonstrated that setting the polarization state of the HZO capacitor before activating the spins generates a nonvolatile change of the coupling network's fc-value, permanently varying the spin-interaction between ferromagnetic and anti-ferromagnetic such that no power is needed for the spin-coupling during the operation of the Ising system. In particular, the HZO capacitor exhibits different nominal capacitance values at 0V depending on its polarization (e.g., positively or negatively polarized), making fc lower or higher than the oscillation frequency of the Pos (1 MHz). For fc<1 MHz, the synchronization of the two POs exhibits out-of-phase output signals, realizing an anti-ferromagnetic interaction. The opposite case produces in-phase output signals, implementing a ferromagnetic interaction.

Figure 16A:
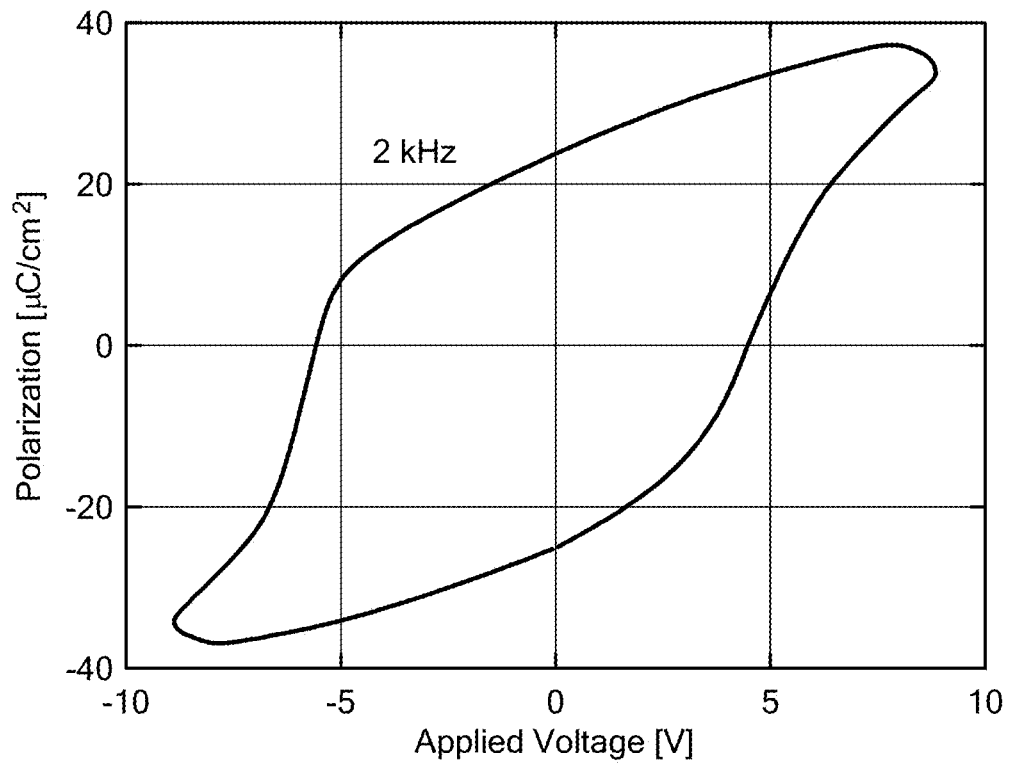
FIG. 16A illustrates a measured polarization loop (PE-Loop) of the HZO varactor of FIGS. 14A-14B obtained by a PUND method and measured at a frequency of 2 kHz.
Figure 16B:
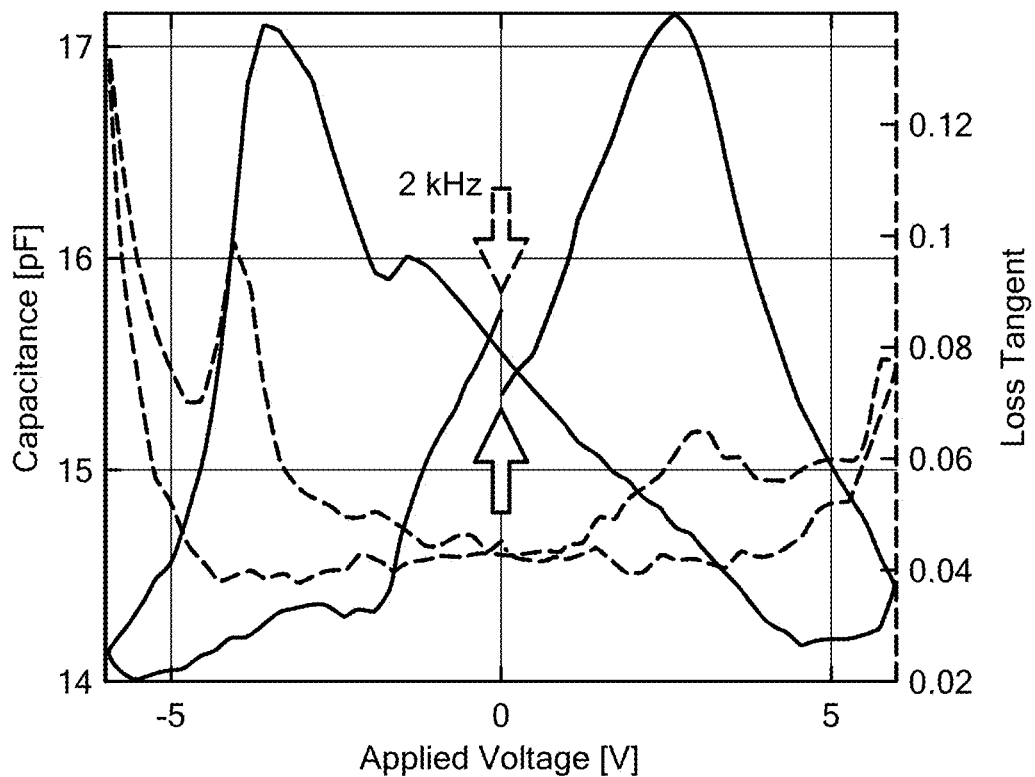
FIG. 16B illustrates a C-V curve of the HZO varactor of FIGS. 14A-14B measured at a frequency of 2 kHz. Taken together.
Figure 17:
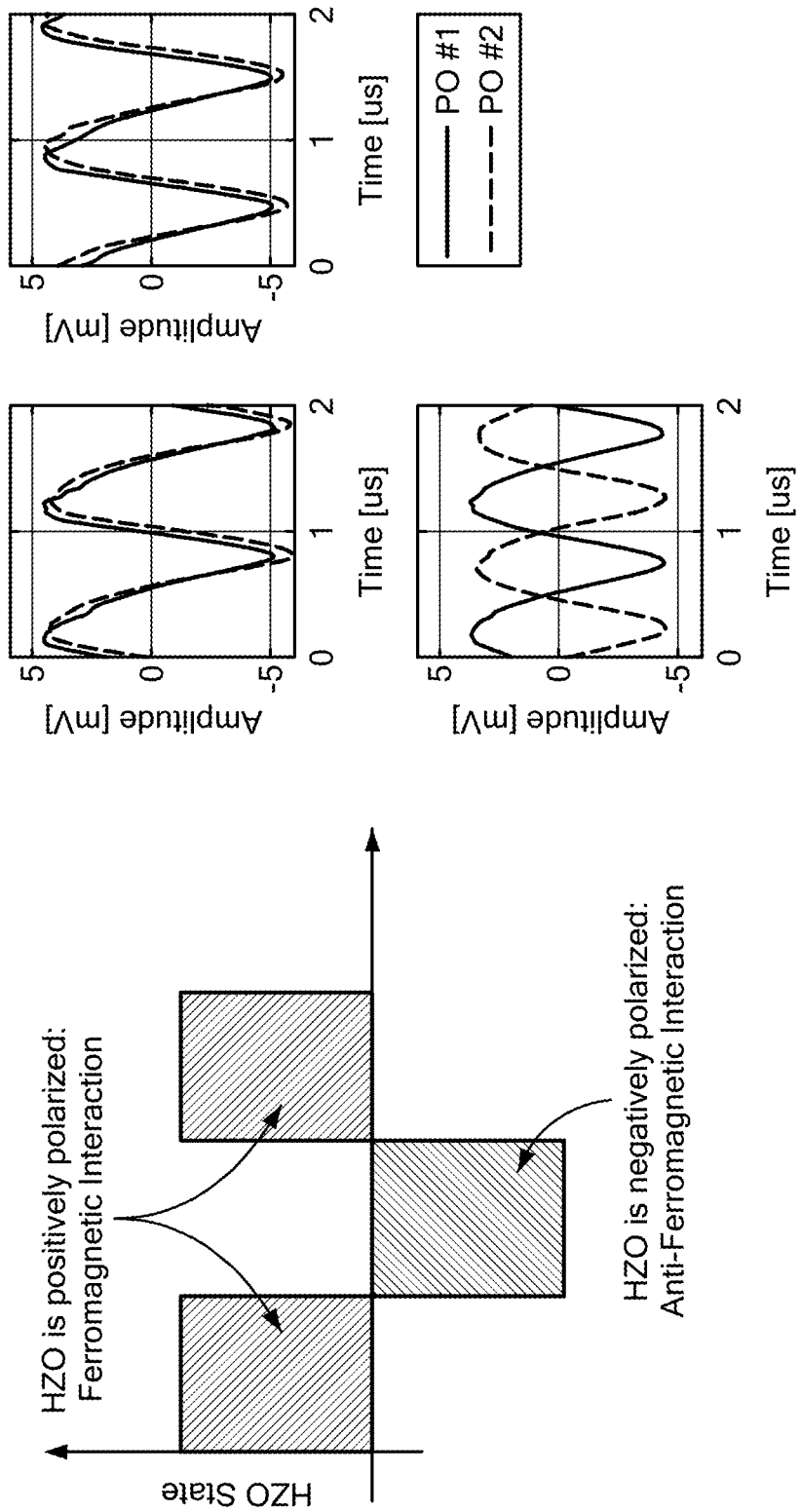
FIG. 17 illustrates a schematic view of an experimental procedure and measured output waveforms of the two POs for both polarization states of the HZO varactor of FIGS. 14A-14B. Two waveforms are reported for the case of the positively polarized HZO varactor in order to show the repeatability of the reported technique in controlling the interaction of the two Ising spins. With a positive polarization, the output waveforms of the coupled POs exhibit in-phase (ferromagnetic) behavior. When the HZO varactor is negatively polarized, the system exhibits anti-phase (anti-ferromagnetic) behavior.
Figure 18A:
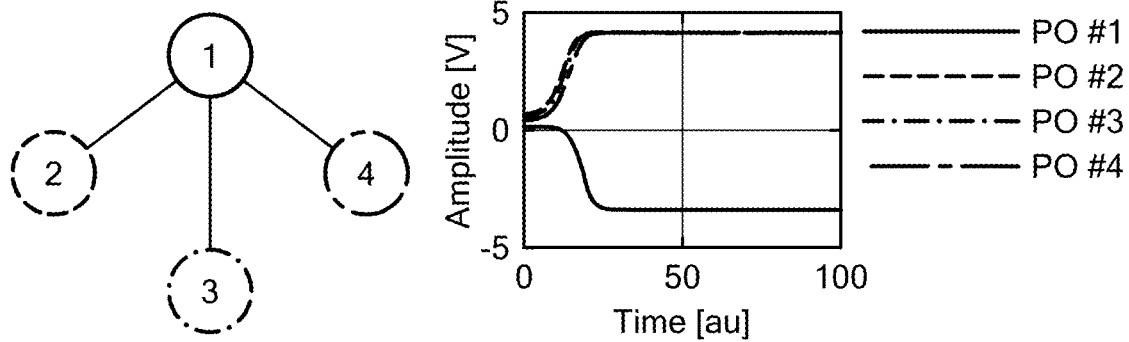
FIG. 18A illustrates a $4^{th}$-order graph where all POs are connected to PO #1.
Figure 18B:
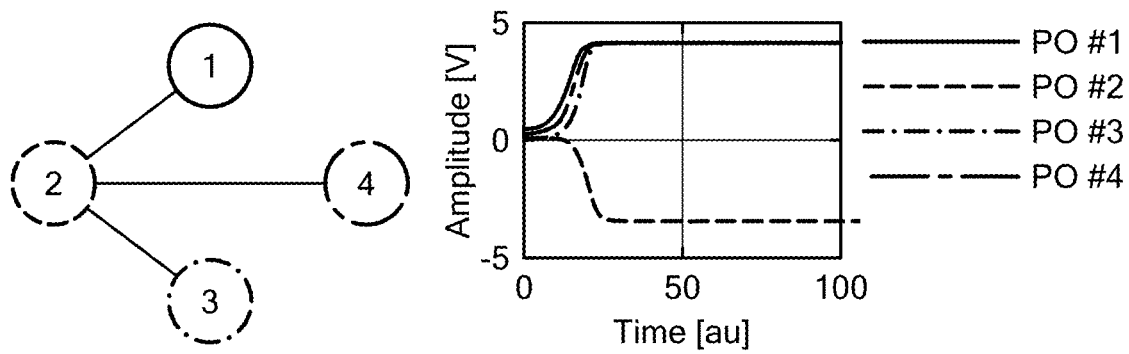
FIG. 18B illustrates a $4^{th}$-order graph where all POs are connected to PO #2.
Figure 18C:
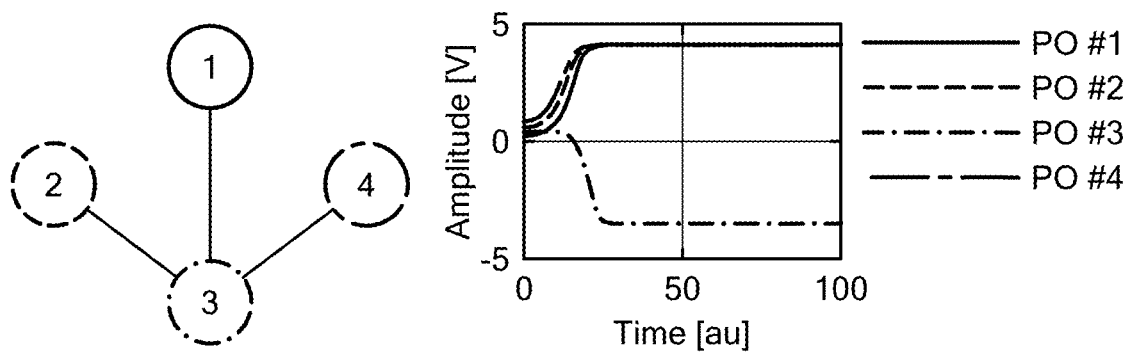
FIG. 18C illustrates a $4^{th}$-order graph where all POs are connected to PO #3.
Figure 18D:
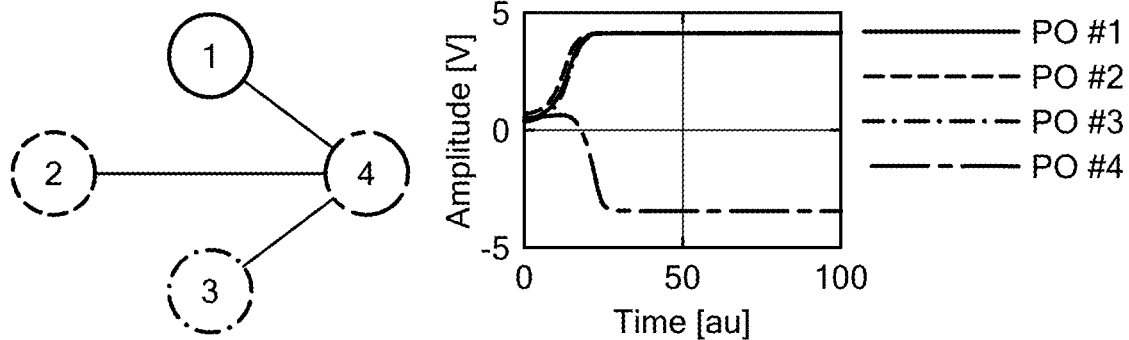
FIG. 18D illustrates a $4^{th}$-order graph where all POs are connected to PO #4.
Figure 18E:
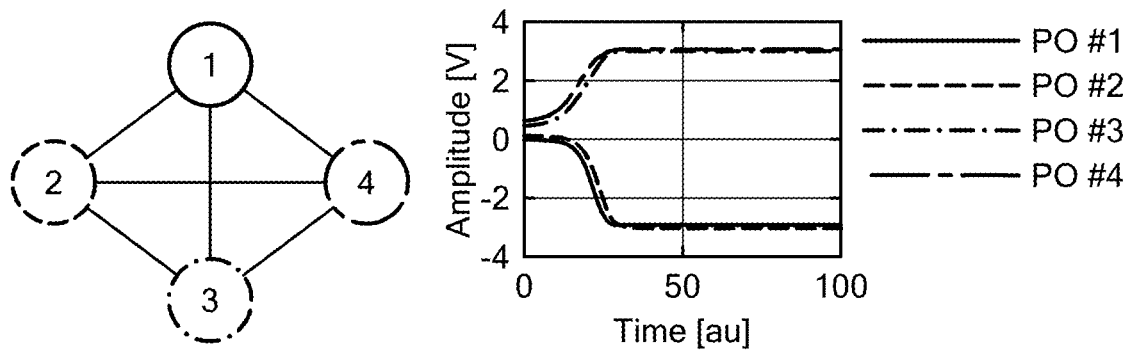
FIG. 18E illustrates a $4^{th}$-order graph where all POs are connected to all other POs. For each of FIGS. 18A-18E, the simulated voltage outputs match with the correct solution for the Max-Cut problem, thereby demonstrating the successful capability of PO-based Ising solvers to find the solution of NP-hard problems.

As shown in FIGS. 14A-14B and 15A-15C, theoretical predictions were validated by fabricating a HZO varactor 250 and wire-bonding it onto a printed-circuit-board (PCB) hosting two coupled identical POs 225 driven by a 2 MHz input signal. The system 200 exhibited the lowest power-threshold (600 nW) ever demonstrated for electronic POs. The HZO varactor's 250 polarization loop and C-V curve are shown in FIGS. 16A-16B. The two POs 225 were driven by the same pump signal and their output waveforms were extracted after switching the HZO varactor 250 between polarization states. As shown in FIG. 17, depending on the polarization state, the POs 225 exhibit in-phase (ferromagnetic) or out-of-phase (anti-ferromagnetic) output voltages. To demonstrate that PO-based systems like the one shown herein can indeed be used as Ising solvers for NP-hard problems, it was analytically demonstrated that a network of the POs effectively solved several selected $4^{th}$-order Max-Cut problems as shown in FIGS. 18A-18E.

The Present Technology Includes the Following Novel Features:
  The Ising system is formed by parametric oscillators built in the electrical domain.
  The coupling of the Ising spins is implemented through a ferroelectric device to enable a zero-power consumption for coupling the spins during operation of the Ising system.
  The Ising system is not DC-biased and can be used to build a computing platform for wireless sensor nodes.
Advantages of the Present Technology Include the Following:
  The system consumes zero power for coupling during the Ising spin operation.
  The system requires a total injected power in the nanowatt range. Thus, Ising systems made of 1,000,000 spins consume less than 1 W of power.
  The system does not require operation at ambient temperature, in contrast to conventional quantum computers.
  The Ising system can be manufactured using the same CMOS process and facilities presently used for integrated circuits.
Uses of the Present Technology Include the Following:
  The system can be used for computation, replacing existing Von Neumann counterparts where they are not adequate.
  The system can be used as a computation unit in wireless sensor nodes, e.g., in the Internet of Things.
  The system can be used to solve NP-Hard problems without requiring operation at cryogenic temperatures.

While example embodiments have been particularly shown and described, it will be understood by those skilled in the art that various changes in form and details may be made therein without departing from the scope of the embodiments encompassed or contemplated herein.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

What is claimed is:

1. An Ising machine comprising:
   a resonant input mesh driven by a pump signal;
   a resonant output mesh coupled to the input mesh through a nonlinear component to form a parametric frequency divider (PFD); and
   the nonlinear component including a varactor and an inductor, wherein the input mesh and the output mesh are couple through the varactor and the inductor, the nonlinear component passively activatable, responsive to the pump signal exceeding a threshold power, to produce a parametric oscillation between the input and output meshes having an oscillation frequency equal to half an angular input frequency of the pump signal,
   wherein an output signal of the PFD can be switched between an in-phase state and an out-of-phase state.

2. The Ising machine of claim 1, wherein a characteristic of the nonlinear component is modulated at the angular input frequency of the pump signal.

3. The Ising machine of claim 1, wherein the nonlinear component has a nonlinear reactance.

4. The Ising machine of claim 1, wherein:
the input mesh includes an input filter to constrain the pump signal within the input mesh to the angular input frequency of the pump signal; and
the output mesh includes an output filter to constrain the output signal within the output mesh to half of the angular input frequency of the pump signal.

5. The Ising machine of claim 1, wherein the output mesh series-resonates at half the angular input frequency of the pump signal.

6. An Ising machine comprising:
a resonant input mesh driven by a pump signal;
a resonant output mesh coupled to the input mesh through a nonlinear component to form a parametric frequency divider (PFD), and
the nonlinear component passively activatable, responsive to the pump signal exceeding a threshold power, to produce a parametric oscillation between the input and output meshes having an oscillation frequency equal to half an angular input frequency of the pump signal,
wherein an output signal of the PFD can be switched between an in-phase state and an out-of-phase start, and
wherein each of the input mesh and the output mesh includes a resonator.

7. The Ising machine of claim 6, wherein each resonator includes one or more of an electrical resonator, a MEMS resonator, a NEMS resonator, an optical resonator, a non-Hermitian resonator, an electromagnetic resonator, or a combination thereof.

8. The Ising machine of claim 7, wherein the electrical resonator includes an LC tank.

9. An Ising machine comprising:
a resonant input mesh driven by a pump signal;
a resonant output mesh coupled to the input mesh through a nonlinear component to form a parametric frequency divider (PFD), and
the nonlinear component passively activatable, responsive to the pump signal exceeding a threshold power, to produce a parametric oscillation between the input and output meshes having an oscillation frequency equal to half an angular input frequency of the pump signal,
wherein an output signal of the PFD can be switched between an in-phase state and an out-of-phase start, and
wherein the nonlinear component and the output mesh are configured as an electrical Mathieu Resonator having the nonlinear component, an intrinsic loss resistance of the PFD, and a load resistance of the PFD.

10. The Ising machine of claim 1, wherein the threshold power of the pump signal is less than 1 µW.

11. The Ising machine of claim 10, wherein the threshold power of the pump signal is 600 nW or less.

12. The Ising machine of claim 1, wherein the input mesh and the output mesh each form at least one of an electrical circuit, an integrated circuits, a micro-electromechanical system (MEMS), a nano-electromechanical system (NEMS), an optical system, a non-Hermitian system, or a combination thereof.

13. An Ising system comprising:
a plurality of parametric frequency dividers (PFDs), each including:
a resonant input mesh driven by a pump signal;
a resonant output mesh coupled to the input mesh through a nonlinear component, and
the nonlinear component passively activatable responsive to the pump signal exceeding a threshold power, to produce a parametric oscillation between the input and output meshes having an oscillation frequency equal to half an angular input frequency of the pump signal,
a plurality of dissipative couplings, each connecting two or more of the output meshes of the plurality of PFDs;
wherein an output signal of each of the PFDs is switchable between an in-phase state and an out-of-phase state;
wherein the pump signal exceeding the threshold power drives an oscillating spin coupling between at least one pair of PFDs connected by one of the dissipative couplings; and
wherein the nonlinear component and the output mesh of each PFD are configured as an electrical Mathieu Resonator having the nonlinear component, an intrinsic loss resistance of the PFD, a load resistance of the PFD, and half of a coupling resistance of the dissipative coupling connected to the output mesh.

14. The Ising system of claim 13, wherein the threshold power required for activation of the parametric oscillation in the out-of-phase state of the PFDs is less than the threshold power required for activation of the parametric oscillation in the in-phase state of the PFDs.

15. An Ising system comprising:
a plurality of parametric frequency dividers (PFDs), each including:
a resonant input mesh driven by a pump signal;
a resonant output mesh coupled to the input mesh through a nonlinear component, and
the nonlinear component passively activatable, responsive to the pump signal exceeding a threshold power, to produce a parametric oscillation between the input and output meshes having an oscillation frequency equal to half an angular input frequency of the pump signal,
a plurality of dissipative couplings, each connecting two or more of the output meshes of the plurality of PFDs;
wherein an output signal of each of the PFDs is switchable between an in-phase state and an out-of-phase state;
wherein the pump signal exceeding the threshold power drives an oscillating spin coupling between at least one pair of PFDs connected by on of the dissipative couplings; and
wherein a collective spin-configuration of the plurality of PFDs is indicative of a solution to at least one of a large-scale nondeterministic polynomial-time (NP) hard problem, a combinatorial optimization problem, or a combination thereof.

16. The Ising system of claim 15, wherein each variable of the combinatorial optimization problem is mapped to a specific one of the PFDs.

17. An Ising machine comprising:
two parametric oscillators driven by a pump signal and coupled through a series LC network;
the series LC network comprising two inductors and a microfabricated MEMS varactor, wherein the pump signal drives an oscillating spin coupling between the parametric oscillators at a resonance frequency, and wherein output signals of the parametric oscillators can be switched between an in-phase state and an out-of-phase state.

18. The Ising machine of claim 17, wherein the system provides a nonvolatile ferroelectric memory characterized by a shift of the resonance frequency resulting in a shift between in-phase output signals of the parametric oscillators, indicative of ferromagnetic interaction, and out-of-phase output signals of the parametric oscillators, indicative of anti-ferromagnetic interaction.

19. The Ising machine of claim 17, wherein zero power is used to maintain the oscillating spin coupling.

20. The Ising machine of claim 17, wherein not more than about 1 nanowatt of power is used to switch between the in-phase and out-of-phase output states.

21. The Ising machine of claim 17, wherein the Ising machine is at least one of a computation device, a portion of a computation device, a node of a computation device, or a combination thereof.

* * * * *